United States Patent
Caldwell et al.

(10) Patent No.: US 8,863,067 B1
(45) Date of Patent: Oct. 14, 2014

(54) SEQUENTIAL DELAY ANALYSIS BY PLACEMENT ENGINES

(75) Inventors: Andrew Caldwell, Santa Clara, CA (US); Steven Teig, Menlo Park, CA (US)

(73) Assignee: Tabula, Inc., Mountain View, CA (US)

( * ) Notice: Subject to any disclaimer, the term of this patent is extended or adjusted under 35 U.S.C. 154(b) by 816 days.

(21) Appl. No.: 12/027,260

(22) Filed: Feb. 6, 2008

(51) Int. Cl.
*G06F 17/50* (2006.01)

(52) U.S. Cl.
USPC .......................................... 716/132; 716/135

(58) Field of Classification Search
USPC .................................................. 716/132–135
See application file for complete search history.

(56) References Cited

U.S. PATENT DOCUMENTS

| | | |
|---|---|---|
| 4,128,890 A | 12/1978 | Irwin et al. |
| 4,135,249 A | 1/1979 | Irwin |
| 4,432,066 A | 2/1984 | Benschop |
| 4,546,446 A | 10/1985 | Machida |
| 4,594,661 A | 6/1986 | Moore et al. |
| 4,873,459 A | 10/1989 | El Gamal et al. |
| 5,191,241 A | 3/1993 | McCollum et al. |
| 5,245,575 A | 9/1993 | Sasaki et al. |
| 5,325,329 A | 6/1994 | Inoue et al. |
| 5,349,250 A | 9/1994 | New |
| 5,357,153 A | 10/1994 | Chiang et al. |
| 5,365,125 A | 11/1994 | Goetting et al. |
| 5,369,622 A | 11/1994 | McLaury |
| 5,386,156 A | 1/1995 | Britton et al. |
| 5,426,378 A | 6/1995 | Ong |
| 5,488,404 A | 1/1996 | Fleck et al. |
| 5,521,835 A | 5/1996 | Trimberger |
| 5,532,958 A | 7/1996 | Jiang et al. |
| 5,546,018 A | 8/1996 | New et al. |
| 5,552,721 A | 9/1996 | Gould |
| 5,589,782 A | 12/1996 | Sharpe-Geisler |
| 5,596,743 A | 1/1997 | Bhat et al. |

(Continued)

FOREIGN PATENT DOCUMENTS

| | | |
|---|---|---|
| EP | 0748053 | 12/1996 |
| EP | 2140548 | 1/2010 |
| WO | WO 2008/115243 | 9/2008 |
| WO | WO 2010/033263 | 3/2010 |

OTHER PUBLICATIONS

Portions of Prosecution History of U.S. Appl. No. 11/081,823, filed Dec. 16, 2008, Rohe, Andre, et al.

(Continued)

*Primary Examiner* — Binh Tat
(74) *Attorney, Agent, or Firm* — Adeli LLP

(57) ABSTRACT

Some embodiments provide a method of designing an integrated circuit (IC). The design is expressed as a graph that includes several nodes that represent several IC components. The nodes include a first set of nodes that represent a set of clocked elements. The method creates a second set of nodes by removing all nodes in the first set from the nodes that represent the IC components. The method identifies a set of edges that connect two nodes in the second set without encompassing a third node in the second set. The method assigns an event time to each node in the second set. The method assigns a cost function based on the event times of the nodes connected by each edge and the number of nodes in the first set encompassed by each edge. The method optimizes the cost function and places the components based on the cost function optimization.

28 Claims, 17 Drawing Sheets

(56) References Cited

U.S. PATENT DOCUMENTS

| | | | |
|---|---|---|---|
| 5,600,263 A | 2/1997 | Trimberger et al. |
| 5,610,829 A | 3/1997 | Trimberger |
| 5,629,637 A | 5/1997 | Trimberger et al. |
| 5,631,578 A | 5/1997 | Clinton et al. |
| 5,640,106 A | 6/1997 | Erickson et al. |
| 5,640,107 A | 6/1997 | Kruse |
| 5,646,544 A | 7/1997 | Iadanza |
| 5,646,545 A | 7/1997 | Trimberger et al. |
| 5,656,950 A | 8/1997 | Duong et al. |
| 5,659,484 A | 8/1997 | Bennett et al. |
| 5,682,107 A | 10/1997 | Tavana et al. |
| 5,692,147 A | 11/1997 | Larsen et al. |
| 5,694,057 A | 12/1997 | Gould |
| 5,701,441 A | 12/1997 | Trimberger |
| 5,719,889 A | 2/1998 | Iadanza |
| 5,732,239 A | 3/1998 | Tobagi et al. |
| 5,732,246 A | 3/1998 | Gould et al. |
| 5,734,925 A | 3/1998 | Tobagi et al. |
| 5,737,235 A | 4/1998 | Kean et al. |
| 5,740,069 A | 4/1998 | Agrawal et al. |
| 5,745,422 A | 4/1998 | Iadanza |
| 5,745,734 A | 4/1998 | Craft et al. |
| 5,761,483 A | 6/1998 | Trimberger |
| 5,764,525 A | 6/1998 | Mahmood et al. |
| 5,764,954 A | 6/1998 | Fuller et al. |
| 5,768,178 A | 6/1998 | McLaury |
| 5,777,360 A | 7/1998 | Rostoker et al. |
| 5,802,003 A | 9/1998 | Iadanza et al. |
| 5,805,477 A | 9/1998 | Perner |
| 5,815,726 A | 9/1998 | Cliff |
| 5,822,217 A | 10/1998 | Shenoy |
| 5,825,662 A | 10/1998 | Trimberger |
| 5,835,751 A | 11/1998 | Chen et al. |
| 5,847,577 A | 12/1998 | Trimberger |
| 5,883,525 A | 3/1999 | Tavana et al. |
| 5,889,411 A | 3/1999 | Chaudhary |
| 5,889,677 A | 3/1999 | Yasuda et al. |
| 5,914,616 A | 6/1999 | Young et al. |
| 5,914,906 A | 6/1999 | Iadanza et al. |
| 5,942,913 A | 8/1999 | Young et al. |
| 5,944,813 A | 8/1999 | Trimberger |
| 5,958,000 A | 9/1999 | Jiang |
| 6,002,991 A | 12/1999 | Conn, Jr. |
| 6,018,559 A | 1/2000 | Azegami et al. |
| 6,023,421 A | 2/2000 | Clinton et al. |
| 6,038,192 A | 3/2000 | Clinton et al. |
| 6,038,392 A | 3/2000 | Ashar et al. |
| 6,044,031 A | 3/2000 | Iadanza et al. |
| 6,054,873 A | 4/2000 | Laramie |
| 6,066,178 A | 5/2000 | Bair et al. |
| 6,069,490 A | 5/2000 | Ochotta et al. |
| 6,075,745 A | 6/2000 | Gould et al. |
| 6,084,429 A | 7/2000 | Trimberger |
| 6,086,628 A | 7/2000 | Dave et al. |
| 6,086,631 A | 7/2000 | Chaudhary et al. |
| 6,088,519 A * | 7/2000 | Koford ................... 716/123 |
| 6,091,263 A | 7/2000 | New et al. |
| 6,091,645 A | 7/2000 | Iadanza |
| 6,107,821 A | 8/2000 | Kelem et al. |
| 6,110,223 A | 8/2000 | Southgate et al. |
| 6,118,707 A | 9/2000 | Gould et al. |
| 6,130,854 A | 10/2000 | Gould et al. |
| 6,134,154 A | 10/2000 | Iwaki et al. |
| 6,140,836 A | 10/2000 | Fujii et al. |
| 6,140,839 A | 10/2000 | Kaviani et al. |
| 6,150,838 A | 11/2000 | Wittig et al. |
| 6,152,612 A | 11/2000 | Liao et al. |
| 6,163,168 A | 12/2000 | Nguyen et al. |
| 6,172,521 B1 | 1/2001 | Motomura |
| 6,173,379 B1 | 1/2001 | Poplingher et al. |
| 6,175,247 B1 | 1/2001 | Scalera et al. |
| 6,184,707 B1 | 2/2001 | Norman et al. |
| 6,184,709 B1 | 2/2001 | New |
| 6,188,240 B1 | 2/2001 | Nakaya |
| 6,204,687 B1 | 3/2001 | Schultz et al. |
| 6,205,076 B1 | 3/2001 | Wakayama et al. |
| 6,229,337 B1 | 5/2001 | Xiao et al. |
| 6,233,191 B1 | 5/2001 | Gould et al. |
| 6,255,849 B1 | 7/2001 | Mohan |
| 6,275,064 B1 | 8/2001 | Agrawal et al. |
| 6,292,019 B1 | 9/2001 | New et al. |
| 6,326,807 B1 | 12/2001 | Veenstra et al. |
| 6,346,824 B1 | 2/2002 | New |
| 6,348,813 B1 | 2/2002 | Agrawal et al. |
| 6,369,610 B1 | 4/2002 | Cheung et al. |
| 6,381,732 B1 | 4/2002 | Burnham et al. |
| 6,404,224 B1 | 6/2002 | Azegami et al. |
| 6,411,128 B2 | 6/2002 | Maeda |
| 6,430,736 B1 | 8/2002 | Levi et al. |
| 6,460,166 B1 | 10/2002 | Reddy et al. |
| 6,469,540 B2 | 10/2002 | Nakaya |
| 6,469,553 B1 | 10/2002 | Sung et al. |
| 6,480,954 B2 | 11/2002 | Trimberger et al. |
| 6,483,343 B1 | 11/2002 | Faith et al. |
| 6,487,709 B1 | 11/2002 | Keller et al. |
| 6,490,707 B1 | 12/2002 | Baxter |
| 6,496,918 B1 | 12/2002 | DeHon et al. |
| 6,501,297 B1 | 12/2002 | Kong |
| 6,515,505 B1 | 2/2003 | Rees |
| 6,515,509 B1 | 2/2003 | Baxter |
| 6,526,559 B2 | 2/2003 | Schiefele et al. |
| 6,529,040 B1 | 3/2003 | Carberry et al. |
| 6,545,501 B1 | 4/2003 | Bailis et al. |
| 6,545,505 B1 | 4/2003 | Chan et al. |
| 6,557,145 B2 * | 4/2003 | Boyle et al. ................... 716/105 |
| 6,573,749 B2 | 6/2003 | New et al. |
| 6,593,771 B2 | 7/2003 | Bailis et al. |
| 6,601,227 B1 | 7/2003 | Trimberger |
| 6,603,330 B1 | 8/2003 | Snyder |
| 6,614,703 B2 | 9/2003 | Pitts et al. |
| 6,629,308 B1 | 9/2003 | Baxter |
| 6,636,070 B1 | 10/2003 | Altaf |
| 6,642,744 B2 | 11/2003 | Or-Bach et al. |
| 6,650,142 B1 | 11/2003 | Agrawal et al. |
| 6,667,635 B1 | 12/2003 | Pi et al. |
| 6,668,361 B2 | 12/2003 | Bailis et al. |
| 6,674,303 B1 | 1/2004 | Morse et al. |
| 6,675,309 B1 | 1/2004 | Baxter |
| 6,686,769 B1 | 2/2004 | Nguyen et al. |
| 6,691,301 B2 | 2/2004 | Bowen |
| 6,701,494 B2 | 3/2004 | Giddens et al. |
| 6,703,861 B2 | 3/2004 | Ting |
| 6,711,729 B1 | 3/2004 | McElvain et al. |
| 6,714,041 B1 | 3/2004 | Darling et al. |
| 6,720,813 B1 | 4/2004 | Yee et al. |
| 6,732,068 B2 | 5/2004 | Sample et al. |
| 6,802,049 B2 * | 10/2004 | Teig et al. ................... 716/124 |
| 6,806,730 B2 | 10/2004 | Bailis et al. |
| 6,807,660 B1 | 10/2004 | Frenkil |
| 6,809,979 B1 | 10/2004 | Tang |
| 6,829,756 B1 | 12/2004 | Trimberger |
| 6,831,479 B2 | 12/2004 | Lo |
| 6,838,902 B1 | 1/2005 | Elftmann et al. |
| 6,851,101 B1 | 2/2005 | Kong et al. |
| 6,892,369 B2 | 5/2005 | Teig et al. |
| 6,894,527 B1 | 5/2005 | Donlin et al. |
| 6,920,627 B2 | 7/2005 | Blodget et al. |
| 6,924,663 B2 | 8/2005 | Masui et al. |
| 6,927,601 B1 | 8/2005 | Lin et al. |
| 6,931,616 B2 | 8/2005 | Teig et al. |
| 6,937,535 B2 | 8/2005 | Ahn et al. |
| 6,956,399 B1 | 10/2005 | Bauer |
| 6,964,029 B2 | 11/2005 | Poznanovic et al. |
| 6,992,505 B1 | 1/2006 | Zhou |
| 6,998,872 B1 | 2/2006 | Chirania et al. |
| 7,003,745 B2 | 2/2006 | Subasic et al. |
| 7,010,667 B2 | 3/2006 | Vorbach et al. |
| 7,028,281 B1 | 4/2006 | Agrawal et al. |
| 7,073,158 B2 | 7/2006 | McCubbrey |
| 7,075,333 B1 | 7/2006 | Chaudhary et al. |
| 7,084,666 B2 | 8/2006 | Madurawe |
| 7,088,134 B1 | 8/2006 | Agrawal et al. |
| 7,088,136 B1 | 8/2006 | Lewis |
| 7,107,568 B2 | 9/2006 | Cronquist |

(56) References Cited

U.S. PATENT DOCUMENTS

| | | |
|---|---|---|
| 7,109,752 B1 | 9/2006 | Schmit et al. |
| 7,112,992 B1 | 9/2006 | Guzman et al. |
| 7,113,421 B2 | 9/2006 | Maeda et al. |
| 7,116,131 B1 | 10/2006 | Chirania et al. |
| 7,120,883 B1 | 10/2006 | van Antwerpen et al. |
| 7,126,372 B2 | 10/2006 | Vadi et al. |
| 7,126,856 B2 | 10/2006 | Sun et al. |
| 7,129,746 B1 | 10/2006 | Balasubramanian et al. |
| 7,138,827 B1 | 11/2006 | Trimberger |
| 7,143,329 B1 | 11/2006 | Trimberger et al. |
| 7,143,377 B1 | 11/2006 | Kudlugi et al. |
| 7,154,298 B1 | 12/2006 | Agrawal et al. |
| 7,154,299 B2 | 12/2006 | Swami et al. |
| 7,157,933 B1 | 1/2007 | Schmit et al. |
| 7,193,440 B1 | 3/2007 | Schmit et al. |
| 7,205,791 B1 | 4/2007 | Lee et al. |
| 7,212,448 B1 | 5/2007 | Trimberger |
| 7,224,182 B1 | 5/2007 | Hutchings et al. |
| 7,236,009 B1 | 6/2007 | Rohe et al. |
| 7,242,216 B1 | 7/2007 | Schmit et al. |
| 7,295,037 B2 | 11/2007 | Schmit et al. |
| 7,342,415 B2 | 3/2008 | Teig et al. |
| 7,350,173 B1 | 3/2008 | Ang et al. |
| 7,353,489 B2 | 4/2008 | Dowling |
| 7,372,297 B1 | 5/2008 | Pugh et al. |
| 7,383,166 B2 | 6/2008 | Ashar et al. |
| 7,383,529 B2 | 6/2008 | Gupta et al. |
| 7,428,721 B2 | 9/2008 | Rohe et al. |
| 7,480,885 B2 | 1/2009 | Frankle et al. |
| 7,489,162 B1 | 2/2009 | Schmit et al. |
| 7,496,879 B2 | 2/2009 | Rohe et al. |
| 7,514,957 B2 | 4/2009 | Schmit et al. |
| 7,521,958 B2 | 4/2009 | Hutchings et al. |
| 7,521,959 B2 | 4/2009 | Teig |
| 7,525,344 B2 | 4/2009 | Teig et al. |
| 7,530,033 B2 | 5/2009 | Caldwell et al. |
| 7,532,032 B2 | 5/2009 | Schmit et al. |
| 7,545,167 B2 | 6/2009 | Teig et al. |
| 7,564,261 B2 | 7/2009 | Schmit et al. |
| 7,576,564 B2 | 8/2009 | Schmit et al. |
| 7,587,698 B1 | 9/2009 | Rohe et al. |
| 7,624,364 B2 * | 11/2009 | Albrecht et al. ............... 716/113 |
| 7,657,855 B1 | 2/2010 | Manaker, Jr. et al. |
| 7,679,401 B1 | 3/2010 | Redgrave |
| 7,694,265 B2 | 4/2010 | Rohe et al. |
| 7,743,354 B2 * | 6/2010 | Albrecht et al. ............... 716/113 |
| 7,779,380 B2 | 8/2010 | Honda |
| 7,818,705 B1 | 10/2010 | Hutton et al. |
| 7,870,529 B2 | 1/2011 | Rohe et al. |
| 7,870,530 B2 | 1/2011 | Rohe et al. |
| 7,898,291 B2 | 3/2011 | Rohe et al. |
| 7,904,867 B2 | 3/2011 | Burch et al. |
| 7,941,776 B2 | 5/2011 | Majumder et al. |
| 7,971,172 B1 | 6/2011 | Pugh et al. |
| 8,089,300 B2 | 1/2012 | Redgrave |
| 8,089,882 B2 | 1/2012 | Guntur et al. |
| 8,093,922 B2 | 1/2012 | Teig et al. |
| 8,112,731 B1 | 2/2012 | Shen et al. |
| 8,136,077 B2 | 3/2012 | McMurchie et al. |
| 8,166,435 B2 | 4/2012 | Teig et al. |
| 8,463,836 B1 | 6/2013 | Pugh et al. |
| 8,664,974 B2 | 3/2014 | Rohe et al. |
| 2001/0007428 A1 | 7/2001 | Young et al. |
| 2001/0010090 A1 * | 7/2001 | Boyle et al. .................. 716/2 |
| 2002/0008541 A1 | 1/2002 | Young et al. |
| 2002/0010853 A1 | 1/2002 | Trimberger et al. |
| 2002/0113619 A1 | 8/2002 | Wong |
| 2002/0125910 A1 | 9/2002 | New et al. |
| 2002/0125914 A1 | 9/2002 | Kim |
| 2002/0161568 A1 | 10/2002 | Sample et al. |
| 2002/0163357 A1 | 11/2002 | Ting |
| 2003/0042931 A1 | 3/2003 | Ting |
| 2003/0079192 A1 | 4/2003 | Cheong et al. |
| 2003/0080777 A1 | 5/2003 | Baxter |
| 2003/0110430 A1 | 6/2003 | Bailis et al. |
| 2003/0182638 A1 | 9/2003 | Gupta et al. |
| 2004/0008055 A1 | 1/2004 | Khanna et al. |
| 2004/0010767 A1 | 1/2004 | Agrawal et al. |
| 2004/0041610 A1 | 3/2004 | Kundu |
| 2004/0044849 A1 | 3/2004 | Stence et al. |
| 2004/0103265 A1 | 5/2004 | Smith |
| 2004/0178818 A1 | 9/2004 | Crotty et al. |
| 2004/0196066 A1 | 10/2004 | Ting |
| 2004/0222817 A1 | 11/2004 | Madurawe |
| 2004/0225970 A1 | 11/2004 | Oktem |
| 2004/0233758 A1 | 11/2004 | Kim et al. |
| 2005/0125478 A1 | 6/2005 | Ng |
| 2005/0132316 A1 | 6/2005 | Suaris et al. |
| 2005/0134308 A1 | 6/2005 | Okada et al. |
| 2005/0193359 A1 | 9/2005 | Gupta et al. |
| 2006/0010415 A1 | 1/2006 | Curtin et al. |
| 2006/0220678 A1 | 10/2006 | Rozas et al. |
| 2006/0220716 A1 | 10/2006 | Nicolaidis |
| 2006/0225002 A1 | 10/2006 | Hassoun et al. |
| 2006/0250168 A1 | 11/2006 | Starr et al. |
| 2007/0016881 A1 | 1/2007 | Gregory et al. |
| 2007/0143577 A1 | 6/2007 | Smith |
| 2007/0214445 A1 * | 9/2007 | DeHon et al. ................... 716/10 |
| 2008/0028347 A1 | 1/2008 | Hiraoglu et al. |
| 2008/0127000 A1 | 5/2008 | Majumder et al. |
| 2008/0216040 A1 | 9/2008 | Furnish et al. |
| 2008/0276208 A1 | 11/2008 | Albrecht et al. |
| 2008/0307378 A1 | 12/2008 | Rohe et al. |
| 2008/0307380 A1 | 12/2008 | Rohe et al. |
| 2009/0243651 A1 | 10/2009 | Caldwell et al. |
| 2009/0249276 A1 | 10/2009 | Wu et al. |
| 2009/0254874 A1 | 10/2009 | Bose |
| 2009/0293028 A1 | 11/2009 | Hiraoglu et al. |
| 2009/0327987 A1 | 12/2009 | Teig et al. |
| 2010/0001759 A1 | 1/2010 | Teig et al. |
| 2010/0066407 A1 | 3/2010 | Rohe et al. |
| 2011/0145776 A1 | 6/2011 | Rohe et al. |
| 2011/0181317 A1 | 7/2011 | Rohe et al. |
| 2012/0185809 A1 | 7/2012 | Kadiyala et al. |
| 2013/0308468 A1 | 11/2013 | Cowie |

OTHER PUBLICATIONS

Portions of Prosecution History of U.S. Appl. No. 11/081,854, filed Aug. 29, 2008, Rohe, Andre, et al.
Portions of Prosecution History of U.S. Appl. No. 12/193,712, filed Sep. 30, 2010, Rohe, Andre, et al.
Portions of Prosecution History of U.S. Appl. No. 12/193,713, filed Oct. 1, 2010, Rohe, Andre, et al.
Portions of Prosecution History of U.S. Appl. No. 12/193,707, filed Dec. 2, 2009, Rohe, Andre, et al.
Portions of Prosecution History of U.S. Appl. No. 11/082,200, filed Feb. 14, 2007, Rohe, Andre, et al.
Portions of Prosecution History of U.S. Appl. No. 11/751,629, filed Apr. 21, 2009, Rohe, Andre, et al.
Portions of Prosecution History of U.S. Appl. No. 12/534,841, filed Oct. 1, 2010, Rohe, Andre, et al.
"§3 Programmable Logic Devices," Digital System Design, 2001 Month N/A, slides 3.1-3.28.
"Design for Low Power in Actel Antifuse FPGAs," Actel Application Note, 2000 Actel Corporation, Sep. 2000, pp. 1-8.
"The Effect of SRAM Table Sharing and Cluster Size on FPGA Area," NPL Date Unknown, pp. 1-10.
"The Xilinx Virtex Series FPGA," Jan. 22, 2001, slides 1-22.
"Unifying Sequential and Spatial Computing with a Single Instruction Set Architecture," ISCA '04, Jun. 19-23, 2004, ACM, Munchen, Oberbayern, Germany.
Agrawal, O., et al., "An Innovative, Segmented High Performance FPGA Family with Variable-Grain-Architecture and Wide-gating Functions," FPGA 99, Feb. 1999, pp. 17-26, ACM, Monterey, CA, USA.
Ahmed, E., et al., "The Effect of LUT and Cluster Size on Deep-Submicron FPGA Performance and Density," FPGA 2000, Feb. 2000, ACM, Monterey, CA, USA.
Alexander, M.J., et al., "Placement and Routing for Performance-Oriented FPGA Layout," VLSI Design: an International Journal of Custom-Chip Design, Simulation, and Testing, 1998, vol. 7, No. 1, pp. 1-23. (Month N/A).

(56) References Cited

OTHER PUBLICATIONS

Alpert, C.J., et al., "Quadratic Placement Revisited," Design Automation Conference, '97, Jun. 1997, ACM.

Altera Corp., "6. DSP Blocks in Stratix II Devices," SII52006-1.0, Feb. 2004, pp. 1-32.

Altera, "Stratix II DSP Performance," White Paper, Feb. 2004, pp. 1-9, ver. 1.0, Altera Corporation, San Jose, CA.

Backus, J., "Can Programming be Liberated from the Von Neumann Style? A Functional Style and its Algebra of Programs," Communications of the ACM, Aug. 1978, pp. 613-641, vol. 21, No. 8, ACM.

Barker, R., "QuickSilver ACM SilverStream Design Methodology with the Inspire SDK Tool Set," A Technology Application Whitepaper, Jan. 26, 2004, pp. 1-8, QuickSilver Technology, Inc., San Jose, California.

Butts, M., "Future Directions of Dynamically Reprogrammable Systems," IEEE 1995 Custom Integrated Circuits Conference, May 1995, pp. 487-494.

Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.

Caspi, E., et al., "A Streaming Multi-Threaded Model," MSP-3, Dec. 2, 2001, pp. 1-23.

Caspi, E., et al., "Stream Computations Organized for Reconfigurable Execution (SCORE): Introduction and Tutorial," Aug. 25, 2000, pp. 1-31, Version 1.0.

Ciemat, J.V., et al., "Annealing Placement by Thermodynamic Combinatorial Optimization," ACM Transactions on Design Automation of Electronic Systems, Jul. 2004, pp. 310-332, vol. 9, No. 3, ACM, New York, NY.

Compton, K., et al., "An Introduction to Reconfigurable Computing," IEEE Computer, Apr. 2000.

Compton, K., et al., "Reconfigurable Computing: A Survey of Systems and Software," ACM Computing Surveys, Jun. 2002, pp. 171-210, vol. 34, No. 2, ACM, New York, NY.

Cong, J., et al., "Combinational Logic Synthesis for LUT Based Field Programmable Gate Arrays," ACM Transactions on Design Automation of Electronic Systems, Apr. 1996, pp. 145-204, vol. 1, No. 2, ACM, Inc.

Cong, J., et al., "Large-Scale Circuit Placement," ACM Transactions on Design Automation of Electronic Systems, Apr. 2005, pp. 389-430, vol. 10, No. 2, ACM Inc., Broadway, New York, NY.

Cong, J., et al., "Optimality and Stability Study of Timing-Driven Placement Algorithms," ICCAD-2003: International Conference on Computer Aided Design, Nov. 2003.

Davare, A., et al., "The Best of Both Worlds: The Efficient Asynchronous Implementation of Synchronous Specifications," DAC '04, Jun. 7-11, 2004, ACM, San Diego, California, USA.

Dehon, A., "Balancing Interconnect and Computation in a Reconfigurable Computing Array (or, why don't you really want 100% LUT utilization)," Proceedings of the International Symposium on Field Programmable Gate Arrays, Feb. 1999, pp. 125-134.

Dehon, A., "DPGA Utilization and Application," Proceedings of the 1996 ACM Fourth International Symposium on Field-Programmable Gate Arrays FPGA, Feb. 11-13, 1996, Monterey, California, USA.

Dehon, A., "Dynamically Programmable Gate Arrays: A Step Toward Increased Computational Density," Proceedings of the Fourth Canadian Workshop on Field-Programmable Devices, May 1996, pp. 47-54.

Dehon, A., "Reconfigurable Architectures for General-Purpose Computing," A.I. Technical Report No. 1586, Oct. 1996, pp. i-353.

Dehon, A., "The Density Advantage of Configurable Computing," IEEE, Apr. 2000, pp. 41-49.

Dehon, A., "Transit Note #121: Notes on Programmable Interconnect," M.I.T. Transit Project, Feb. 1995, pp. 1-13.

Dehon, A., et al., "Design Patterns for Reconfigurable Computing," Proceedings of the IEEE Symposium on Field-Programmable Custom Computing Machines, Apr. 2004.

Dehon, A., et al., "DPGA-Coupled Microprocessors: Commodity ICs for the Early $21^{st}$ Century," FCCM '94-IEEE Workshop on FPGAs for Custom Computing Machines, Apr. 1994, Napa Valley, California, USA.

Dehon, A., et al., "Reconfigurable Computing: What, Why, and Implications for Design Automation," DAC 1999, Jun. 1999, ACM, New Orleans, Louisiana.

Enzler, R., et al., "Virtualizing Hardware with Multi-Context Reconfigurable Arrays," Lecture Notes in Computer Science, Sep. 2003, pp. 151-160.

Gayasen, A., et al., "Reducing Leakage Energy in FPGAs Using Region-Constrained Placement," FPGA '04, Feb. 22-24, 2004, pp. 51-58, ACM, Monterey, California, USA.

George, V., "Low Energy Field-Programmable Gate Array," A Dissertation Submitted in Partial Satisfaction o the Requirements for the Degree of Doctor of Philosophy in Engineering-Electrical Engineering and Computer Sciences in the Graduate Division of the University of California, Berkeley, Fall 2000 Month N/A, pp. 1-190.

Giraud-Carrier, C., "A Reconfigurable Data Flow Machine for Implementing Functional Programming Languages", SIGPLAN Notices, Sep. 1994, vol. 29 No. 9, pp. 22-28.

Goldstein, S.C., et al., "PipeRench: A Coprocessor for Streaming Multimedia Acceleration", In International Symposium on Computer Architecture (ISCA), pp. 28-39, May 1999.

Goldstein, S.C., et al., "PipeRench: A Reconfigurable Architecture and Compiler," IEEE, Apr. 2000, pp. 70-77.

Hauck, S., et al., "Montage: An FPGA for Synchronous and Asynchronous Circuits," Field-Programmable Gate Arrays: Architectures and Tools for Rapid Prototyping, 1993 Month N/A, Springer-Verlag, Berlin.

Hauck, S., et al., "Totem: Domain-Specific Reconfigurable Logic," IEEE Transactions on VLSI Systems, 2006 Month N/A, pp. 1-25.

Heidari, G., et al., "Introducing a Paradigm Shift in the Design and Implementation of Wireless Devices," A Wireless Devices Whitepaper, Apr. 28, 2004 but © 2003, pp. 1-10, QuickSilver Technology, Inc., San Jose, California.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology, May 23, 1997, pp. 1-86, 107-109.

IBM, "Cell Broadband Engine Architecture, Version 1.0," Aug. 8, 2005, pp. 1-319, USA.

IBM, "SPU Application Binary Interface Specification, Version 1.3," CBEA JSRE Series, Aug. 1, 2005, pp. iv-26, USA.

IBM, "SPU Assembly Language Specification, Version 1.2," CBEA JSRE Series, Aug. 1, 2005, pp. iii-22, USA.

IBM, "SPU C/C++ Language Extensions, Version 2.0" CBEA JSRE Series, Aug. 1, 2005, pp. iv-84, USA.

IBM, "Synergistic Processor Unit Instruction Set Architecture, Version 1.0," Aug. 1, 2005, pp. 1-257, USA.

Kaviani, A., et al., "Computational Field Programmable Architecture," Custom Integrated Circuits Conference, 1998, Proceedings of the IEEE 1998, May 11-14, 1998.

Kaviani, A., et al., "Hybrid FPGA Architecture," Proceedings of the 1996 ACM Fourth International Symposium on Field-Programmable Gate Arrays, Feb. 11-13, 1996, pp. 3-9, Monterey, California, USA.

Keutzer, K., "Overview of *configurable* architectures," Feb. 28, 2002, slides 1-29.

Kocan, F., et al., "Logic Modules with Shared SRAM Tables for Field-Programmable Gate Arrays," FPL 2004, Aug./Sep. 2004, pp. 289-300, Springer-Verlag, Berlin Heidelberg.

Kudlugi, et al., "Static Scheduling of Multidomain Circuits for Fast Functional Verification", IEEE Transactions on Computer-Aided Design of Integrated Circuits and Systems, vol. 21, No. 11, Nov. 2002, pp. 1253-1268.

Lehn, D.I., et al., "Evaluation of Rapid Context Switching on a CSRC Device," Proceedings of the International Conference on Engineering of Reconfigurable Systems and Algorithms, Jun. 24-27, 2002.

(56) References Cited

OTHER PUBLICATIONS

Lemieux, G., et al., "Generating Highly-Routable Sparse Crossbars for PLDs," FPGA 2000, Feb. 2000, ACM, Monterey, California, USA.

Lemieux, G., et al., "Using Sparse Crossbars within LUT Clusters," FPGA 2001, Feb. 11-13, 2001, ACM, Monterey, CA.

Lertora, F., et al., "Handling Different Computational Granularity by a Reconfigurable IC Featuring Embedded FPGAs and a Network-On-Chip," 13th Annual IEEE Symposium on Field-Programmable Custom Computing Machines (FCCM 2005) 2005, Apr. 18-20, 2005.

Lewis, D., et al., "The Stratix-II Routing and Logic Architecture," Proceedings of the 2005 ACM/SIGDA 13th International Symposium on Field-Programmable Gate Arrays, pp. 1-22, Feb. 20-22, 2005, Monterey, California, USA.

Lin, J.Y., et al., "Placement-Driven Technology Mapping for LUT-Based FPGAs," FPGA '03, Feb. 23-25, 2003, pp. 121-126, ACM, Monterey, California, USA.

Ling, A., "The Search for the Optimal FPGA Logic Block," 2001 Month N/A, ACM.

M2000, "FlexEOS Embedded FPGA Cores," 2003 Month N/A, M2000.

Markovskiy, Y., et al., "Analysis of Quasi-Static Scheduling Techniques in a Virtualized Reconfigurable Machine," FPGA '02, Feb. 24-26, 2002, ACM, Monterey, California, USA.

Master, P., "The Next Big Leap in Reconfigurable Systems," A Technology Vision Whitepaper, Apr. 28, 2004 but © 2003, pp. 1-8, QuickSilver Technology, Inc., San Jose, California.

Mathstar, Inc., "MathStar FPOA Architecture: A New Approach to High Throughput, Scalable, and Reprogrammable Design," Technology Overview, 2003 Month N/A, MathStar, Inc.

Mazumder, "Parallel VLSI-Routing Models for Polymorphic Processors Array", 10th International Conference on VLSI Design, IEEE, Jan. 1997, pp. 10-14.

Mirsky, E., et al., "MATRIX: A Reconfigurable Computing Architecture with Configurable Instruction Distribution and Deployable Resources," Proceedings of the IEEE Workshop on FPGAs for Custom Computing Machines, Apr. 1996.

Mirsky, E., et al., "MATRIX: A Reconfigurable Computing Device with Configurable Instruction Distribution and Deployable Resources (Extended Abstract)," Hot Chips Symposium 1997, Aug. 1997.

Morris, K., "Lattice Launches XP: Non-Volatility at the Forefront of FPGA," FPGA and Programmable Logic Journal, Mar. 1, 2005, pp. 1-5, Techfocus Media, Inc.

Morris, K., "Rationalizing Reconfigurability: The Importance of Being Programmable," FPGA and Structured ASIC Journal, Sep. 27, 2005.

Nelson, B.E., "Reconfigurable Computing: An Introduction and Overview," Sep. 23, 1998, pp. 1-43.

Niedzielski, D., "An Overview of Reconfigurable Computing," NPL Date Unknown.

Ochotta, E.S., et al., "A Novel Predictable Segmented FPGA Routing Architecture," FPGA 98, Feb. 1998, pp. 3-11, ACM, Monterey, CA, USA.

Ohkura, J., et al., "Dataflow in the Adaptive Computing Machine (ACM)," A Technology Application Whitepaper, Apr. 28, 2004 but © 2003, pp. 1-9, QuickSilver Technology, Inc., San Jose, California.

Parhami, B., "Part IV: Low-Diameter Architectures," ECE 254B: Advanced Computer Architecture: Parallel Processing, UCSB, Spring 2005 Month N/A, slides 1-93, Behrooz Parhami, Santa Barbara, California, USA.

Pedram, M., "IEEE Circuits and Systems Society Distinguished Lecturer Program," 2003-2004 Month N/A.

Perissakis, S., et al., "Embedded DRAM for a Reconfigurable Array," Proceedings of the 1999 Symposium on VLSI Circuits, Jun. 1999, slides 1-24.

Perissakis, S., et al., "Embedded DRAM for a Reconfigurable Array," Proceedings of the 1999 Symposium on VLSI Circuits, Jun. 1999.

Plunkett, B., "In Search of the SDR Holy Grail," A Technology Application Whitepaper, Apr. 28, 2004 but © 2003, pp. 1-7, QuickSilver Technology, Inc., San Jose, California, USA.

Plunkett, B., et al., "Adapt2400 ACM Architecture Overview," A Technology Whitepaper, 2004 Month N/A, pp. 1-9, QuickSilver Technology, Inc.

QuickLogic Corp., "Ultra-Low Power FPGA Combining Performance, Density, and Embedded RAM", Eclipse II Family Data Sheet, Nov. 2005, pp. 1-92, QuickLogic Corporation, US.

QuickSilver Technology, Inc., "Adapt2000 ACM System Platform," Apr. 2004, pp. 1-39, QuickSilver Technology, Inc., San Jose, California, USA.

QuickSilver Technology, Inc., "InSpire SDK Tool Set," Product Brief, 2004 Month N/A, QuickSilver Technology, Inc., San Jose, California, USA.

QuickSilver Technology, Inc., "QS2412 Adaptive Computing Machine," Product Brief, 2004 Month N/A, QuickSilver Technology, Inc., San Jose, California, USA.

Rahman, A., et al., "Wiring Requirement and Three-Dimensional Integration Technology for Field Programmable Gate Arrays," IEEE Transactions on Very Large Scale Integration (VLSI) Systems, Feb. 2003, pp. 44-54, vol. 11, No. 1, IEEE.

Rose, J., "Hard vs. Soft: The Central Question of Pre-Fabricated Silicon," 34th International.Symposium on Multiple-Valued Logic (ISMVL '04), May 2004, pp. 2-5.

Sambhwani, S., et al., "Implementing W-CDMA Transceiver Structure on an Adaptive Computing Platform," A Technology Application Whitepaper, Apr. 28, 2004 but © 2003, pp. 1-12, QuickSilver Technology, Inc., San Jose, California.

Sankar, Y., "Ultra-Fast Automatic Placement for FPGAs," A Thesis Submitted in Conformity with the Requirements for the Degree of Master of Applied Science Graduate Dept. of Electrical and Computer Engineering, University of Toronto, 1999 Month N/A, pp. ii-73.

Scalera, S.M., et al., "A Mathematical Benefit Analysis of Context Switching Reconfigurable Computing," Proceedings of the 5th Reconfigurable Architectures Workshop (RAW), Mar. 30, 1998, vol. 1388 of Lecture Notes in Computer Science, pp. 73-78.

Schaumont, P., et al., "A Quick Safari Through the Reconfiguration Jungle," 38th Design Automation Conference, Jun. 2001, pp. 172-177, Las Vegas, Nevada, USA.

Schmit, H., "Extra-Dimensional Island-Style FPGAs," Field Programmable Logic and Application (FPL 2003), Sep. 2003, pp. 1-10.

Schmit, H., "Extra-Dimensional Island-Style FPGAs," Field Programmable Logic and Application (FPL 2003), Sep. 2003, slides 1-26.

Schmit, H., "Incremental Reconfiguration for Pipelined Applications," Proceedings of the 5th IEEE Symposium on FPGA-Based Custom Computing Machines, Apr. 16-18, 1997.

Schmit, H., et al., "FPGA Switch Block Layout and Evaluation," FPGA '02, Feb. 24-26, 2002, ACM, Monterey, California, USA.

Schmit, H., et al., "PipeRench: A Virtualized Programmable Datapath in 0.18 Micron Technology," Proceedings of the IEEE 2002 Custom Integrated Circuits Conference, May 12-15, 2002, pp. 63-66.

Schmit, H., et al., "Queue Machines: Hardware Compilation in Hardware," Proceedings of the 10th Annual IEEE Symposium on Field-Programmable Custom Computing Machines, Apr. 22-24, 2002.

Sharma, A., et al., "Accelerating FPGA Routing Using Architecture-Adaptive A* Techniques," Proceedings of the IEEE Conference on Field-Programmable Technology 2005, Dec. 11-14, 2005.

Singh, A., et al., "Interconnect Resource-Aware Placement for Hierarchical FPGAs," Proceedings of the 2001 IEEE/ACM International Conference on Computer-Aided Design, Nov. 2001.

Singh, A., et al., "PITIA: An FPGA for Throughput-Intensive Applications," IEEE Transactions on Very Large Scale Integration (VLSI) Systems, Jun. 2003, pp. 354-363, vol. 11, No. 3, IEEE.

Slade, A.L., et al., "Reconfigurable Computing Application Frameworks," 11th Annual IEEE Symposium on Field-Programmable Custom Computer Machines, Apr. 9-11, 2003.

Snider, G., "Performance-Constrained Pipelining of Software Loops onto Reconfigurable Hardware," FPGA '02, Feb. 24-26, 2002, pp. 177-186, ACM, Monterey, California, USA.

(56) References Cited

OTHER PUBLICATIONS

Tau, E., et al., "A First Generation DPGA Implementation," Proceedings of the Third Canadian Workshop on Field-Programmable Devices, May 1995, pp. 138-143.
Tau, E., et al., "Transit Note #114: A First Generation DPGA Implementation," M.I.T. Transit Project, Jan. 1995, pp. 1-8.
Teifel, J., et al., "Highly Pipelined Asynchronous FPGAs," Proceedings of the 2004 ACM/SIGDA 12$^{th}$ International Symposium on Field Programmable Gate Arrays, Feb. 22-24, 2004, Monterey, California, USA.
Tessier, R., et al., "Balancing Logic Utilization and Area Efficiency in FPGAs," Proceedings of the Roadmap to Reconfigurable Computing, 10$^{th}$ International Workshop on Field Programmable Logic and Applications, Aug. 27-30, 2000, pp. 535-544.
Tom, M., et al., "Clustering of Large Designs for Channel-Width Constrained FPGAs," University of British Columbia, Department of Electrical and Computer Engineering, Jun. 2005, slides 1-39, Vancouver, British Columbia, Canada.
Tom, M., et al., "Logic Block Clustering of Large Designs for Channel-Width Constrained FPGAs" DAC 2005, Jun. 13-17, 2005, pp. 726-731, ACM, Anaheim, California, USA.
Trimberger, S. "Effects of FPGA Architecture on FPGA Routing," 32$^{nd}$ ACM/IEEE Design Automation Conference, Jun. 1995, ACM.
Tsu, W., et al., "HSRA: High-Speed, Hierarchical Synchronous Reconfigurable Array," Proceedings of the International Symposium on Field Programmable Gate Arrays, Feb. 1999, pp. 69-78.
Wawrzynek, J., "EECS150-Digital Design: Lecture 5—Field Programmable Gate Arrays (FPGAs)," Feb. 4, 2002, slides 1-20, multiple slides per page.
Weaver, N., et al., "The SFRA: A Corner-Turn FPGA Architecture," FPGA '04, Feb. 22-24, 2004, ACM, Monterey, California, USA.
Wilton, S.J.E., "Memory-to-Memory Connection Structures in FPGAs with Embedded Memory Arrays," FPGA 97, Feb. 1997, pp. 10-16, ACM, Monterey, California, USA.
Xilinx, Inc., "Virtex-4 Family Overview," Advance Product Specification, Sep. 10, 2004, pp. 21-30, v1.1, Xilinx, Inc.
Zilic, Z. et al., "Using BDDs to Design ULMs for FPGAs," Proceedings of the 1996 ACM Fourth International Symposium on Field-Programmable Gate Arrays (FPGA '96), Feb. 11-13, 1996, pp. 1-10, Monterey, California, USA.
Zuchowski, P.S., "A Hybrid ASIC and FPGA Architecture," Proceedings of the 2002 IEEE/ACM International Conference on Computer-Aided Design, Nov. 10-14, 2002, pp. 187-194, San Jose, California, USA.
U.S. Appl. No. 11/081,855, filed Mar. 15, 2005, Schmit, Herman, et al.
U.S. Appl. No. 11/269,869, filed Nov. 7, 2005, Pugh, Daniel, et al.
U.S. Appl. No. 12/050,143, filed Mar. 17, 2008, Pugh, Daniel, et al.
U.S. Appl. No. 12/702,290, filed Feb. 8, 2010, Redgrave, Jason.
U.S. Appl. No. 13/011,840, filed Jan. 21, 2011, Rohe, Andre, et al.
Portions of prosecution history of U.S. Appl. No. 11/081,859, filed Oct. 11, 2007, Teig, Steven, et al.
Portions of prosecution history of U.S. Appl. No. 12/021,291, filed Jan. 28, 2009, Teig, Steven, et al.
Portions of prosecution history of U.S. Appl. No. 11/081,855, filed Nov. 16, 2006, Schmit, Herman, et al.
Updated Portions of Prosecution History of U.S. Appl. No. 12/193,712, filed Nov. 30, 2010, Rohe, Andre, et al.
Updated Portions of Prosecution History of U.S. Appl. No. 12/193,713, filed Nov. 30, 2010, Rohe, Andre, et al.
Updated Portions of prosecution history of U.S. Appl. No. 12/534,841, filed Jan. 11, 2011, Rohe, Andre, et al.
Portions of prosecution history of U.S. Appl. No. 11/269,869, filed Jul. 30, 2010, Pugh, Daniel, et al.
Portions of prosecution history of U.S. Appl. No. 11/269,505, filed Dec. 3, 2007, Pugh, Daniel, et al.
Portions of prosecution history of U.S. Appl. No. 12/050,143, filed May 10, 2011, Pugh, Daniel, et al.
Portions of prosecution history of U.S. Appl. No. 11/292,952, filed Jan. 27, 2010, Redgrave, Jason.
Portions of prosecution history of U.S. Appl. No. 12/702,290, filed Apr. 5, 2011, Redgrave, Jason.
Portions of prosecution history of U.S. Appl. No. 11/293,856, filed Jan. 5, 2009, Schmit, Herman, et al.
Portions of prosecution history of U.S. Appl. No. 11/754,299, filed Nov. 18, 2008, Schmit, Herman, et al.
Portions of prosecution history of U.S. Appl. No. 11/754,300, filed Dec. 9, 2008, Teig, Steven.
Portions of prosecution history of U.S. Appl. No. 11/754,301, filed Dec. 15, 2008, Teig, Steven, et al.
Portions of prosecution history of U.S. Appl. No. 12/419,289, filed Mar. 4, 2011, Teig, Steven, et al.
International Search Report for PCT/US2007/069831, Sep. 24, 2008 (mailing date), Tabula, Inc.
International Preliminary Report on Patentability for PCT/US2007/069831, Sep. 22, 2009 (issuance date), Tabula, Inc.
Written Opinion for PCT/US2007/069831, Sep. 24, 2008 (mailing date), Tabula, Inc.
Portions of Prosecution History of EP07797815.3, Feb. 28, 2011, Tabula, Inc.
International Search Report for PCT/US2009/033840, May 29, 2009 (mailing date), Tabula, Inc.
Written Opinion for PCT/US2009/033840, May 29, 2009 (mailing date), Tabula, Inc.
International Preliminary Report on Patentability for PCT/US2009/033840, Mar. 31, 2011 (mailing date), Tabula, Inc.
Albrecht, Christoph, et al., "Sequential Logic Synthesis with Retiming in Encounter RTL Compiler (RC)," CDNLive!, Digital IC Design, 2006 Month N/A, 16 pages, Silicon Valley, CA, USA.
Amerson, R., et al., "Plasma: An FPGA for Million Gate Systems," Proceedings of the 1996 ACM 4$^{th}$ International Symposium on FPGAs, Feb. 11-13, 1996, pp. 10-16, Monterey, California, USA.
Andraka Consulting Group, Inc., "Multiplication in FPGAs," http://www.andraka.com/multipli.htm, Jan. 25, 2006, pp. 1-7.
Chiricescu, S., et al., "Morphable Multipliers," FPL 2002, LNCS 2438, Sep. 2002, pp. 647-656, Springer-Verlag Berlin Heidelberg.
Deokar, Rahul B., et al., "A Graph-theoretic Approach to Clock Skew Optimization," In Proc. International Symp. on Circuits and Systems, 1994 Month N/A, 4 pages.
Hauck, S., et al., "High-Performance Carry Chains for FPGAs," FPGA 98, Feb. 1998, pp. 223-233, ACM, Monterey, CA, USA.
Hurst, Aaron P., et al., "Physical Placement Driven by Sequential Timing Analysis," Proc. ICCAD '04, 2004 Month N/A, pp. 1-8.
Hurst, Aaron P., et al., "Physical Placement Driven by Sequential Timing Analysis," Proc. ICCAD '04, 2004 Month N/A, slides 1-21.
Leiserson, Charles E., et al., "Retiming Synchronous Circuitry," Systems Research Center, Aug. 20, 1986, 50 pages, Palo Alto, CA, USA.
Pedram, M., et al., "A New Design for Double Edge Triggered Flip-flops", Feb. 10-13, 1998.
Sheeran, M., "Generating Fast Multipliers Using Clever Circuits," Lecture Notes in Computer Science, Springer Berlin/Heidelberg, 2004 Month N/A, 15 pages.
Singh, A., et al., "Interconnect Pipelining in a Throughput-Intensive FPGA Architecture," FPGA 2001, Feb. 11-13, 2001, pp. 153-160, ACM, Monterey, CA, USA.
Xing, S., et al., "FPGA Adders: Performance Evaluation and Optimal Design," IEEE Design & Test of Computers, Jan.-Mar. 1998, pp. 24-29, IEEE.
U.S. Appl. No. 13/831,144, filed Mar. 14, 2013, Tabula, Inc.
Updated portions of prosecution history of U.S. Appl. No. 12/965,815, filed Feb. 25, 2014, Rohe, Andre, et al.
Updated portions of prosecution history of U.S. Appl. No. 13/011,840, filed Feb. 6, 2014, Rohe, Andre, et al.
Updated portions of prosecution history of U.S. Appl. No. 11/269,869, filed Feb. 8, 2013, Pugh, Daniel, et al.
Updated portions of prosecution history of U.S. Appl. No. 12/702,290, filed Aug. 23, 2011, Redgrave, Jason.
Updated portions of prosecution history of U.S. Appl. No. 12/215,697, filed Mar. 24, 2012, Teig, Steven, et al.
Updated portions of prosecution history of U.S. Appl. No. 12/419,289, filed Dec. 14, 2011, Teig, Steven, et al.
Portions of prosecution history of U.S. Appl. No. 13/831,144 , filed Mar. 18, 2014, Tabula, Inc.

(56) References Cited

OTHER PUBLICATIONS

Updated portions of prosecution history of EP07797815.3, Sep. 5, 2013 (mailing date), Tabula, Inc.
Albrecht, C., "Provably Good Global Routing by a New Approximation Algorithm for Multicommodity Flow," ISPD 2000, Month Unknown, 2000, pp. 19, 2-7, ACM, San Diego, CA.
Alpert, C., et al., "A Semi-Persistent Clustering Technique for VLSI Circuit Placement," ISPD '05, Apr. 3-6, 2005, pp. 200-207, ACM, San Francisco, California, USA.
Axelsson, E., et al., "Wired: Wire-aware Circuit Design," Month Unknown, 2005, pp. 1-15.
Braunstein, L.A., et al., "Optimal Paths in Disordered Complex Networks," Physical Review Letters, Oct. 17, 2003, pp. 168701-(1)-168701-(4), vol. 91, No. 16, The American Physical Society.
Braunstein, L.A., et al., "Threat Networks and Threatened Networks: Basic Principles and Practical Applications," Apr. 4, 2005, pp. 1-31.
Brenner, U., et al., "An Effective Congestion Driven Placement Framework," ISPD '02, Apr. 7-10, 2002, pp. 6-11, ACM, San Diego, California, USA.
Cancho, R.F., et al., "The Topology of Technology Graphs: Small World Patterns in Electronic Circuits," Month Unknown, 2001, pp. 1-6.
Cancho, R.F., et al., "Topology of Technology Graphs: Small World Patterns in Electronic Circuits," Physical Review E, 2001, pp. 046119-(1)-046119-(5), vol. 64, 046119, The American Physical Society.
Chen, H., et al., "An Algebraic Multigrid Solver for Analytical Placement with Layout Based Clustering," DAC 2003, Jun. 2-6, 2003, 6 pages, ACM, Anaheim, California, USA.
Cong, J., et al., "A New Enhanced SPFD Rewiring Algorithm," Dec. 2002, 7 pages.
Eisenmann, H., et al., "Generic Global Placement and Floorplanning," DAC 98, Jun. 15-19, 1998, pp. 269-274, San Francisco, CA, USA.
Fleischer, L.K., "Approximating Fractional Multicommodity Flow Independent of the Number of Commodities," Proceedings of the 40th Annual Symposium on Foundations of Computer Science, Month Unknown, 1999, pp. 1-16.
Hutchings, Brad L., et al., "Unifying Simulation and Execution in a Design Environment for FPGA Systems," IEEE Transactions on Very Large Scale Integration (VLSI) Systems, Feb. 2001, pp. 201-205, vol. 9, No. 1.
Hutchings, Brad, et al., "A CAD Suite for High-Performance FPGA Design," Proceedings of the Seventh Annual IEEE Symposium on Field-Programmable Custom Computing Machines, Apr. 1999, 13 pages.
Hutchings, Brad, et al., "Designing and Debugging Custom Computing Applications," IEEE Design & Test of Computers, Jan. 2000, pp. 20-28.
Li, C., et al., "Routability-Driven Placement and White Space Allocation," Mar. 2010, 8 pages.
Luk, Wayne, et al., "Compilation Tools for Run-Time Reconfigurable Designs," FPGAs for Custom Computing Machines, 1997 Proceedings., The 5th Annual IEEE Symposium on FPGA-Based Custom Computing Machines, Apr. 16-18, 1997, pp. 56-65.
Ramachandaran, P., et al., "Optimal Placement by Branch-and-Price," Month Unknown, 2005, 6 pages.
Ren, H., et al., "Sensitivity Guided Net Weighting for Placement Driven Synthesis," ISPD '04, Apr. 18-21, 2004, 8 pages, ACM, Phoenix, Arizona, USA.
Scholl, C., "Multi-output Functional Decomposition with Exploitation of Don't Cares," May 19-21, 1997, 6 pages.
Soviani, Cristian, et al., "Optimizing Sequential Cycles through Shannon Decomposition and Retiming", Design, Automation, and Test in Europe, Mar. 10, 2006, pp. 1085-1090.
Tong, K.Y., et al., "Regular Logic Fabrics for a Via Patterned Gate Array (VPGA)," Proceedings of the IEEE 2003 Custom Integrated Circuits Conference 2003, Sep. 21-24, 2003, 4 pages.
Tsay, R. S., et al., "An Analytic Net Weighting Approach for Performance Optimization in Circuit Placement," 28th ACM/IEEE Design Automation Conference, Month Unknown, 1991, pp. 620-625, Paper 37.2, ACM.
Vemuri, N., et al., "BDD-Based Logic Synthesis for LUT-Based FPGAs," ACM Transactions on Design Automation of Electronic Systems, Oct. 2002, pp. 501-525, vol. 7, No. 4, ACM.
Portions of prosecution history of U.S. Appl. No. 12/965,815, filed Sep. 14, 2011, Rohe, Andre, et al.
Portions of prosecution history of U.S. Appl. No. 13/011,840, filed Jun. 17, 2011, Rohe, Andre, et al.
Portions of prosecution history of U.S. Appl. No. 12/215,697, filed Dec. 27, 2011, Rohe, Andre, et al.

* cited by examiner

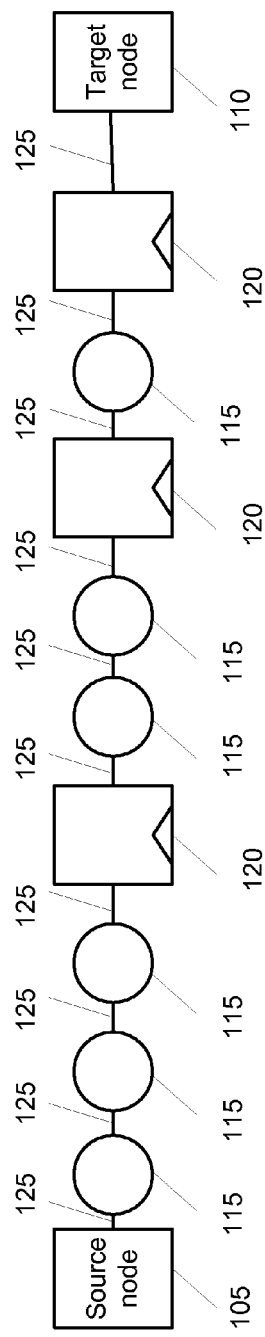
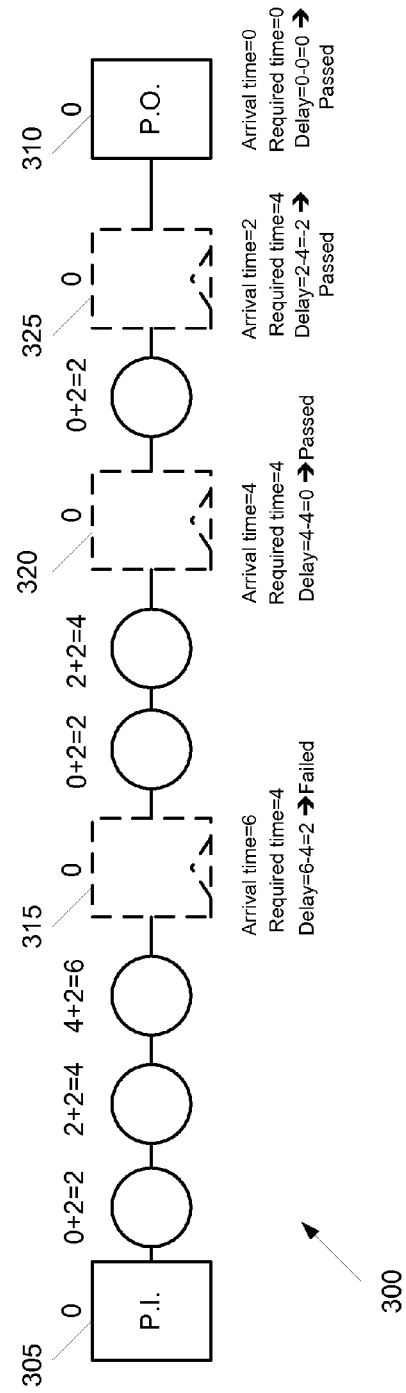

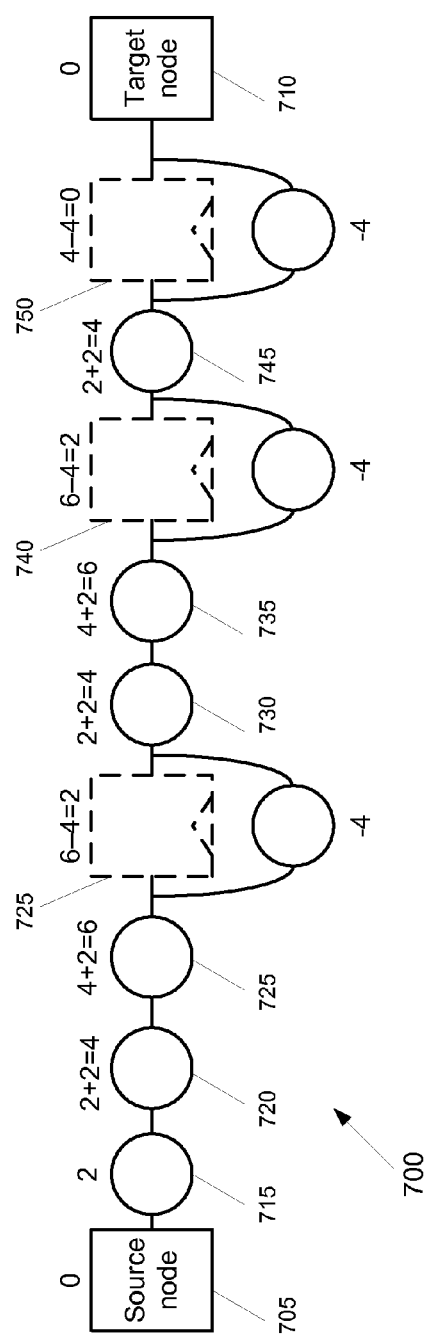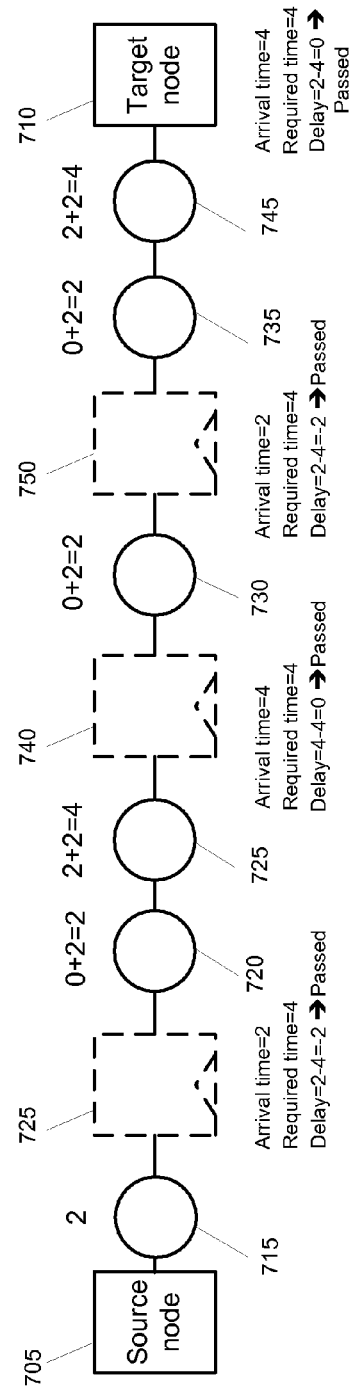

SEQUENTIAL DELAY ANALYSIS BY PLACEMENT ENGINES

FIELD OF THE INVENTION

The present invention is directed towards placement engines for integrated circuits.

BACKGROUND OF THE INVENTION

An IC is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

Electronic Design Automation (EDA) tools are automated tools used in IC design. Placement and routing are steps in automatic design of ICs in which a layout of a larger block of the circuit or the whole circuit is created from layouts of smaller sub-blocks. During placement, the positions of the sub-blocks in the design area are determined. These sub-blocks are interconnected during routing. A placer assigns exact locations for circuit components within the IC chip's core area. A placer typically has several objectives such as minimizing total wire length, timing optimization, reducing congestion, and minimizing power. The placer takes a given synthesized circuit netlist with a technology library and produces a placement layout. The layout is optimized according to a set of placer objectives.

The maximum delay through the critical path of a chip determines the clock cycle and, therefore, the speed of the chip. The timing optimization is performed to ensure that no path exists with delay exceeding a maximum specified delay.

SUMMARY OF THE INVENTION

Some embodiments provide a method of designing an integrated circuit (IC). The design is expressed as a graph that includes several nodes that represent several IC components. The nodes include a first set of nodes that represent a set of clocked elements. The method creates a second set of nodes by removing all nodes in the first set from the nodes that represent the IC components. The method identifies a set of edges that connect two nodes in the second set without encompassing a third node in the second set. The method assigns an event time to each node in the second set. The method assigns a cost function based on the event times of the nodes connected by each edge and the number of nodes in the first set encompassed by each edge. The method optimizes the cost function and places the components based on the cost function optimization.

In some embodiments, the cost function is further based on horizontal and vertical coordinates of the nodes on the graph. In some embodiments, the cost function is optimized by changing at least one of the event time and a coordinate of a node. In some embodiments, all clocked elements in the first set of nodes are retimable clocked elements. In some embodiments, the nodes in the second set include clocked elements that cannot be retimed. In some embodiments, the nodes in the second set include input and out nodes of the graph. In some embodiments, the nodes in the second set include any nodes with timing constraints. In some embodiments, the nodes in the second set include storage elements. In some embodiments, the IC is either an application-specific integrated circuit (ASIC), structured ASIC, field-programmable gate arrays (FPGA), programmable logic devices (PLD), complex programmable logic devices (CPLD), or system on chip (SOC), or system-in-package (SIP).

In some embodiments, the IC is a reconfigurable IC that includes at least one reconfigurable circuit that reconfigures during an operation of the IC. In some embodiments, at least one reconfigurable circuit can reconfigure at a first clock rate that is faster than a second clock rate which is specified for a particular design of the IC. In some embodiments, the second clock has a clock cycle that includes several sub-cycles. In these embodiments, placing the IC components includes assigning each node in the second set of nodes to a particular sub-cycle of the second clock.

Some embodiments provide a method of designing an integrated circuit (IC). The method optimizes a cost function that includes at least one time variable. The method places the IC components based on the cost function optimization. The placing is performed only once after optimizing the cost function. In some embodiments, the time variable includes several event times that are assigned to the components in the IC design. In some embodiments, the cost function further includes horizontal and vertical coordinates of each component. The cost function is optimized by changing at least one of the event time and a coordinate of a component.

Some embodiments provide a method of designing an integrated circuit (IC). The IC design is expressed as a graph that includes several edges and several nodes that represent several IC components. Each edge connects two nodes without encompassing a third node. The method assigns an event time to each node in the graph. The method assigns a cost function for each edge based on the event times of the nodes connected by each edge. The method optimizes the cost function and places the IC components based on the optimized cost function. In some embodiments, the cost function is further based on horizontal and vertical coordinates of the nodes on the graph. In some embodiments, the cost function is optimized by changing at least one of the event time and a coordinate of a node. In some embodiments, the IC is either an application-specific integrated circuit (ASIC), structured ASIC, field-programmable gate arrays (FPGA), programmable logic devices (PLD), complex programmable logic devices (CPLD), system on chip (SOC), system-in-package (SIP), or reconfigurable IC.

BRIEF DESCRIPTION OF THE DRAWINGS

The novel features of the invention are set forth in the appended claims. However, for purpose of explanation, several embodiments of the invention are set forth in the following figures.

FIG. 1 illustrates a path that includes computational and clocked elements between a source node and a target node in some embodiments.

FIG. 3 illustrates an example of combinational delay computation in some embodiments.

FIG. 7 illustrates an example of sequential delay computation in some embodiments.

FIG. 9 illustrates retiming clocked elements across a path in some embodiments to meet timing requirements in all timed paths.

DETAILED DESCRIPTION OF THE INVENTION

Figure 2:
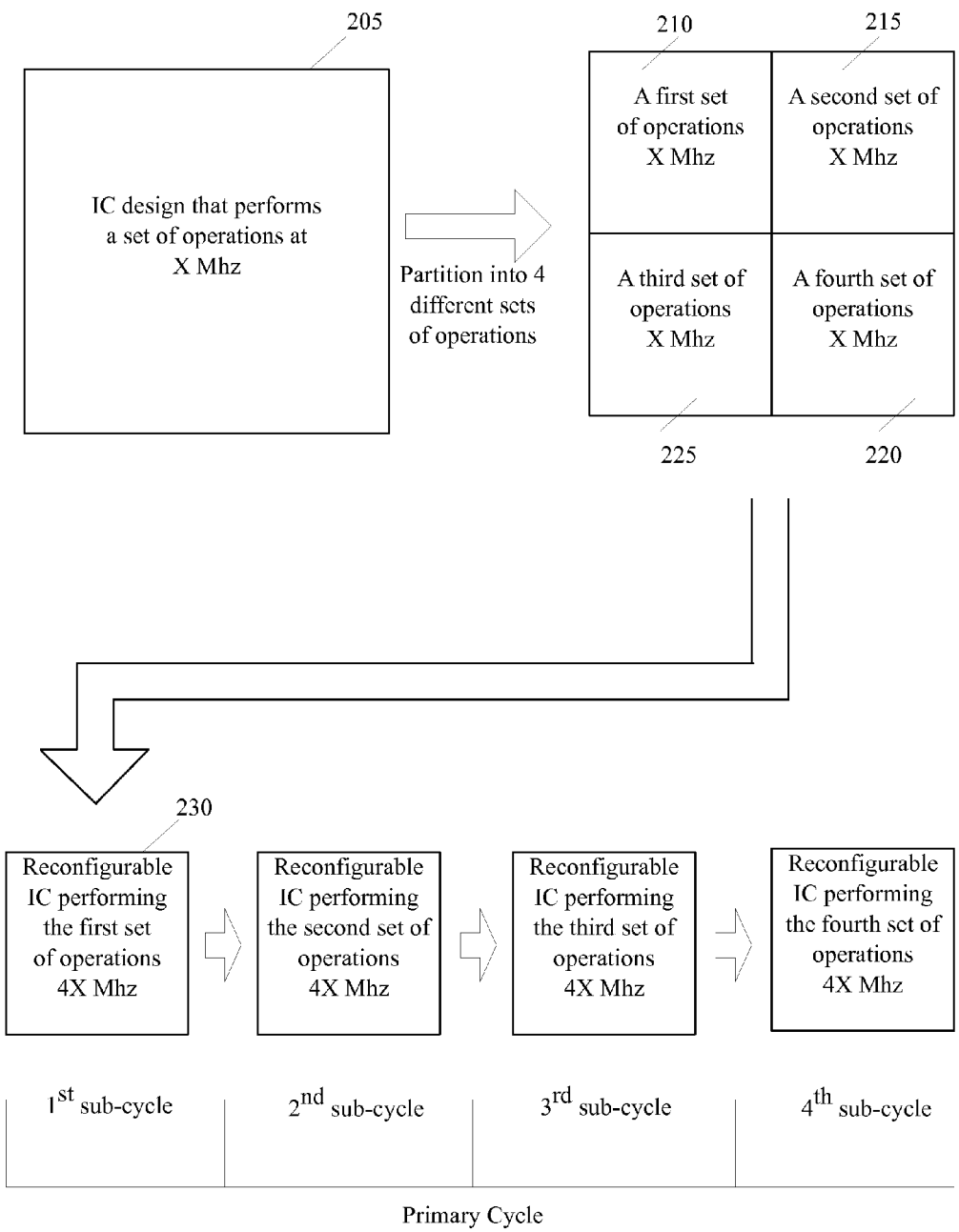
FIG. 2 conceptually illustrates an example of a sub-cycle reconfigurable IC.

In the following description, numerous details are set forth for purpose of explanation. However, one of ordinary skill in the art will realize that the invention may be practiced without the use of these specific details. For instance, not all embodiments of the invention need to be practiced with the specific devices referred to below. In other instances, well-known structures and devices are shown in block diagram form in order not to obscure the description of the invention with unnecessary detail.

I. Overview

Some embodiments provide a method of designing an integrated circuit (IC). The design is expressed as a graph that includes several nodes that represent several IC components. The nodes include a first set of nodes that represent a set of clocked elements. The method creates a second set of nodes by removing all nodes in the first set from the nodes that represent the IC components. The method identifies a set of edges that connect two nodes in the second set without encompassing a third node in the second set. The method assigns an event time to each node in the second set. The method assigns a cost function based on the event times of the nodes connected by each edge and the number of nodes in the first set encompassed by each edge. The method optimizes the cost function and places the components based on the cost function optimization.

In some embodiments, the cost function is further based on horizontal and vertical coordinates of the nodes on the graph. In some embodiments, the cost function is optimized by changing at least one of the event time and a coordinate of a node. In some embodiments, all clocked elements in the first set of nodes are retimable clocked elements. In some embodiments, the nodes in the second set include clocked elements that cannot be retimed. In some embodiments, the nodes in the second set include input and out nodes of the graph. In some embodiments, the nodes in the second set include any nodes with timing constraints. In some embodiments, the nodes in the second set include storage elements. In some embodiments, the IC is either an application-specific integrated circuit (ASIC), structured ASIC, field-programmable gate arrays (FPGA), programmable logic devices (PLD), complex programmable logic devices (CPLD), or system on chip (SOC), or system-in-package (SIP).

In some embodiments, the IC is a reconfigurable IC that includes at least one reconfigurable circuit that reconfigures during an operation of the IC. In some embodiments, at least one reconfigurable circuit can reconfigure at a first clock rate that is faster than a second clock rate which is specified for a particular design of the IC. In some embodiments, the second clock has a clock cycle that includes several sub-cycles. In these embodiments, placing the IC components includes assigning each node in the second set of nodes to a particular sub-cycle of the second clock.

Some embodiments provide a method of designing an integrated circuit (IC). The method optimizes a cost function that includes at least one time variable. The method places the IC components based on the cost function optimization. The placing is performed only once after optimizing the cost function. In some embodiments, the time variable includes several event times that are assigned to the components in the IC design. In some embodiments, the cost function further includes horizontal and vertical coordinates of each component. The cost function is optimized by changing at least one of the event time and a coordinate of a component.

Some embodiments provide a method of designing an integrated circuit (IC). The IC design is expressed as a graph that includes several edges and several nodes that represent several IC components. Each edge connects two nodes without encompassing a third node. The method assigns an event time to each node in the graph. The method assigns a cost function for each edge based on the event times of the nodes connected by each edge. The method optimizes the cost function and places the IC components based on the optimized cost function. In some embodiments, the cost function is further based on horizontal and vertical coordinates of the nodes on the graph. In some embodiments, the cost function is optimized by changing at least one of the event time and a coordinate of a node. In some embodiments, the IC is either an application-specific integrated circuit (ASIC), structured ASIC, field-programmable gate arrays (FPGA), programmable logic devices (PLD), complex programmable logic devices (CPLD), system on chip (SOC), system-in-package (SIP), or reconfigurable IC.

Several more detailed embodiments of the invention are described in sections below. Before describing these embodiments further, several terms and concepts used in the disclosure are described below in Section II. This discussion is followed by the discussion in Section III of combinational and sequential delays. Next, Section IV describes several embodiments of placement engines that also perform timing analysis. Last, Section V describes an electronics system with which some of the embodiments of the invention are implemented.

II. Terms and Concepts

A. Graph Representation of IC Designs

A netlist is a graph representation of an IC design. The graph is represented by a collection of node and edges. The nodes represent components of the IC and the edges represent connections between these components. The edges connect the nodes but do not go through (i.e., do not encompass) any nodes. In an IC design, each component lies on one or more signal paths ("paths"). A path is a sequence of nodes and edges in a netlist. The starting node is referred to as the source node and the end node is referred to as the sink or target node. The source and target nodes are also referred to as endpoints of a path. The source and target designations of the endpoints are based on the direction of the signal flow through the path.

A timed path is a path whose both endpoints are timed elements. Timed elements include primary inputs (through which the circuit receives external input), primary outputs (through which the circuit sends outputs to external circuits), clocked elements, storage elements, or any node with timing constraints (e.g., a node with a fixed time, either because the node cannot be retimed or the node is specified as when it should occur).

FIG. 1 illustrates a timed path 100 between a source node 105 and a target node 110 in some embodiments. The path 100 includes six computational elements 115 (shown as circles), three clocked elements 120 (shown as rectangles), and ten edges 125. Some embodiments utilize registers or latches as clocked elements. FIG. 1 also shows other smaller timed paths. For instance, the path starting from the source node 105 and ending to clocked element 120 is also a timed path. In order for an IC design to meet timing requirements, total delay (including computation delays and signal propagation delays) on each timed path must be less than or equal to one clock period.

The arrival time of a signal is the time elapsed for a signal to arrive at a certain point. The reference, or time 0, is taken from a source node. In some embodiments, when the source node is a primary input, the reference time is taken as the arrival time of a signal received at the primary input. Also, when the source node is a clocked element, the reference time is taken as the time a clock signal is received at the clocked element.

To calculate the arrival time of a signal at a node, delay calculations for all components and edges on the path are required. The required time is the latest time at which a signal can arrive without making the clock cycle longer than desired.

The time difference between the arrival time of a signal and the required arrival time of the signal is referred to as slack. The slack for a node is expressed by the following equation (A):

$$\text{slack} = \text{required arrival time} - \text{arrival time} \qquad (A)$$

A positive (or zero) slack at a node indicates that the node has met its timing requirements. A positive slack also implies that the arrival time of the signal at that node may be increased by the value of the slack without affecting the overall delay of the circuit. Conversely, a negative slack implies that a path is too slow. Therefore, the path must be sped up (or the reference signal delayed) if the whole circuit is to work at the desired speed. A critical path is defined as a timed path with largest negative slack.

B. Configurable IC's

A configurable IC is a circuit that can "configurably" perform a set of operations. Specifically, a configurable circuit receives "configuration data" that specifies the operation that the configurable circuit has to perform from the set of operations that it can perform. In some embodiments, the configuration data is generated outside of the configurable IC. In these embodiments, a set of software tools converts a high-level IC design description (e.g., a circuit representation or a hardware description language design) into a set of configuration data that can configure the configurable IC (or more accurately, the configurable circuits of the configurable IC) to implement the IC design.

C. Reconfigurable IC's

A reconfigurable IC is a configurable IC that has at least one circuit that reconfigures during runtime. In other words, a reconfigurable IC is an IC that has reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it receives a different set of configuration data. Some embodiments of the invention are implemented in reconfigurable ICs that are sub-cycle reconfigurable (i.e., can reconfigure circuits on a sub-cycle basis). In some embodiments, a reconfigurable IC has a large number of logic and interconnect circuits (e.g., hundreds, thousands, etc. of such circuits). Some or all of these circuits can be reconfigurable.

In some embodiments, runtime reconfigurability means reconfiguring without resetting the reconfigurable IC. Resetting a reconfigurable IC entails in some cases resetting the values stored in the state elements of the IC, where state elements are elements like latches, registers, and non-configuration memories (e.g., memories that store the user signals as opposed to the memories that store the configuration data of the configurable circuits). In some embodiments, runtime reconfigurability means reconfiguring after the reconfigurable IC has started processing of the user data. Also, in some embodiments, runtime reconfigurability means reconfiguring after the reconfigurable IC has powered up. These definitions of runtime reconfigurability are not mutually exclusive. Examples of configurable and reconfigurable ICs are described in detail in U.S. patent application Ser. No. 11/081,859, now U.S. Pat. No. 7,342,415, entitled "Configurable IC with Interconnect Circuits that also Perform Storage Operations", filed on Mar. 15, 2005.

D. Sub-Cycle Reconfigurable IC

FIG. 2 conceptually illustrates an example of a sub-cycle reconfigurable IC. Specifically, in its top left hand corner, this figure illustrates an IC design 205 that operates at a clock speed of X MHz. Typically, an IC design is initially specified in a hardware description language (HDL), and a synthesis operation is used to convert this HDL representation into a circuit representation. After the synthesis operation, the IC design includes numerous electronic circuits, which are referred to below as "components."

As further illustrated in FIG. 2, the operations performed by the components in the IC design 205 can be partitioned into four sets of operations 210-225, with each set of operations being performed at a clock speed of X MHz. FIG. 2 then illustrates that these four sets of operations 210-225 can be performed by one sub-cycle reconfigurable IC 230 that operates at 4X MHz. In some embodiments, four cycles of the 4X MHz clock correspond to four sub-cycles within a cycle of the X MHz clock. Accordingly, this figure illustrates the reconfigurable IC 230 reconfiguring four times during four cycles of the 4X MHz clock (i.e., during four sub-cycles of the X MHz clock). During each of these reconfigurations (i.e., during each sub-cycle), the reconfigurable IC 230 performs one of the identified four sets of operations. In other words, the faster operational speed of the reconfigurable IC 230 allows this IC to reconfigure four times during each cycle of the X MHz clock, in order to perform the four sets of operations sequentially at a 4X MHz rate instead of performing the four sets of operations in parallel at an X MHz rate.

III. Combinational and Sequential Delays

A. Combinational Delay

Combinational delay computation is performed on a path that starts from a clocked element source node and ends to a clocked element target node without encompassing any other clocked elements. Alternatively, the path can either start with any timed element and end to a clocked element or start with a clocked element and end to a timed element without encompassing any other clocked elements. The delay starts at zero and is accumulated as the path is traversed in the signal direction from a source node to a target node.

FIG. 3 illustrates a path 300 in some embodiments. As shown, path 300 starts from a primary input node 305 and ends to a primary output node 310. The path includes six computational elements (shown as circles) and three clocked elements (shown as rectangles). For this example, the clock period is assumed to be four time units. Also, for simplicity it is assumed that each computational element takes two time units to perform its operation.

Furthermore, for simplicity, it is assumed that there are no delays attributed to wiring lengths in this example. Alternatively, the delays attributed to wiring lengths between two endpoints can be added to the delay of the target node. As shown in FIG. 3, path 300 includes four smaller paths that either (1) start from a clocked element source node and end to a clocked element target node, (2) start from a timed element source node and end to a clocked element target node, or (3) start from a clocked element source node and end to a timed element target node. None of these paths encompass any other clocked elements. These four paths are the paths between (1) timed element 305 and clocked element 315, (2) clocked element 315 and clocked element 320, (3) clocked element 320 and clocked element 325, and (4) clocked element 325 and timed element 310. The combinational delay for each of these paths is the accumulated delays between the source and target nodes and is calculated by adding all computation and propagation delays between the source and target nodes.

Figure 4:
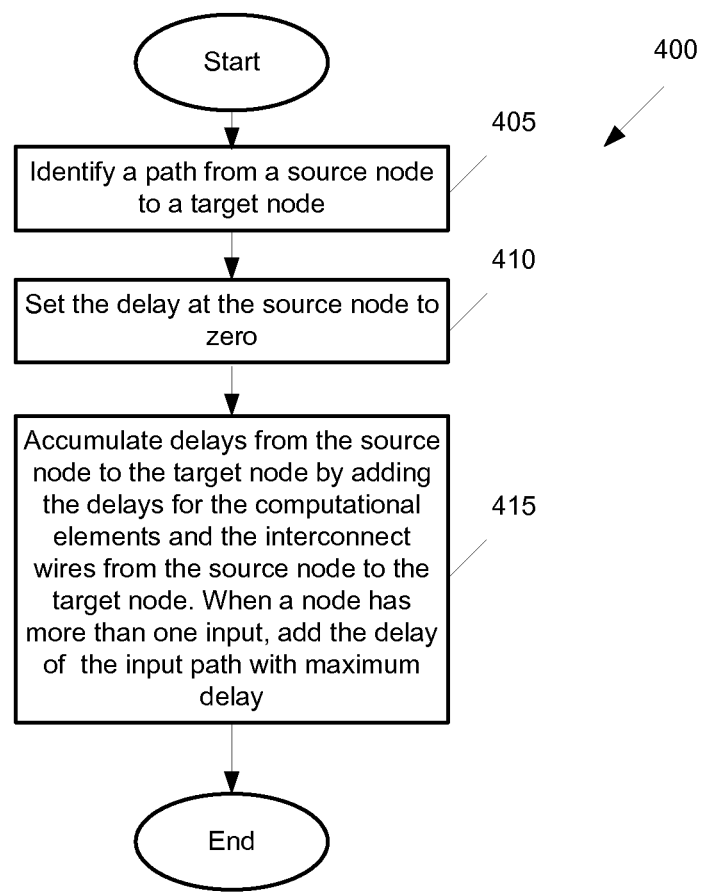
FIG. 4 conceptually illustrates a process to compute accumulated delays in some embodiments.

Calculation of accumulated delays for each path is described by reference to FIGS. 4 and 5. FIG. 4 conceptually illustrates a process 400 for calculating accumulated delays for a path that starts with a source node and ends with a target node. As shown in FIG. 4, the process identifies (at 405) the source and target nodes of the path. Next, the process sets (at 410) the accumulated delay at the source node to zero.

Next, the process accumulates delays from the source node to the target node by adding the delays for each computational element. If the delays caused by interconnect wire lengths are not negligible, the process also adds (at 415) these delays to the accumulated delays. Also, when a node has more than one input, the delay of the input path with maximum delay is considered in computation of the sequential delay.

Figure 5:
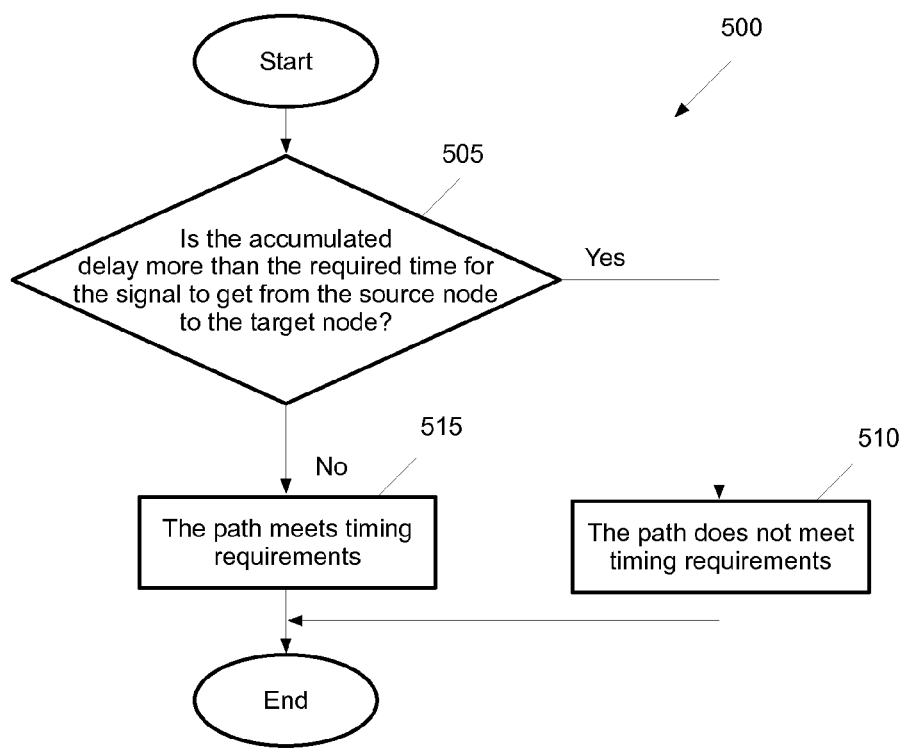
FIG. 5 conceptually illustrates a process that utilizes combinational delay computation to determine whether a path has met its timing requirements in some embodiments.

FIG. 5 conceptually illustrates a process 500 that utilizes combinational delay computation to determine whether a path has met its timing requirements in some embodiments. As shown, the process determines (at 505) whether the accumulated delay is more than the required time for the signal to get from the source node to the target node. In the example of FIG. 3, the required time for each of the four identified paths is one clock period (or four time units). When the accumulated delay is more than the required time, the process determines (at 510) that the path does not meet its timing requirements. On the other hand, when the delay is less than or equal to the required time, the process determines (at 515) that the path meets its timing requirements.

Utilizing process 400, the combinational delays for the elements of the four paths identified on FIG. 3 are computed and the results are displayed on top of each element. Utilizing process 500, it is determined whether each path meets its timing requirements. As shown, when the combinational delay computations are compared with the required times for each target node, the timing requirements for the first target node (315) fails and the timing requirement for the other three target nodes (320, 325, and 310) pass. Since the path between 305 and 315 fails the timing requirement, the overall path 300, which includes the failed path, also fails the timing requirements.

B. Sequential Delay

Figure 6:
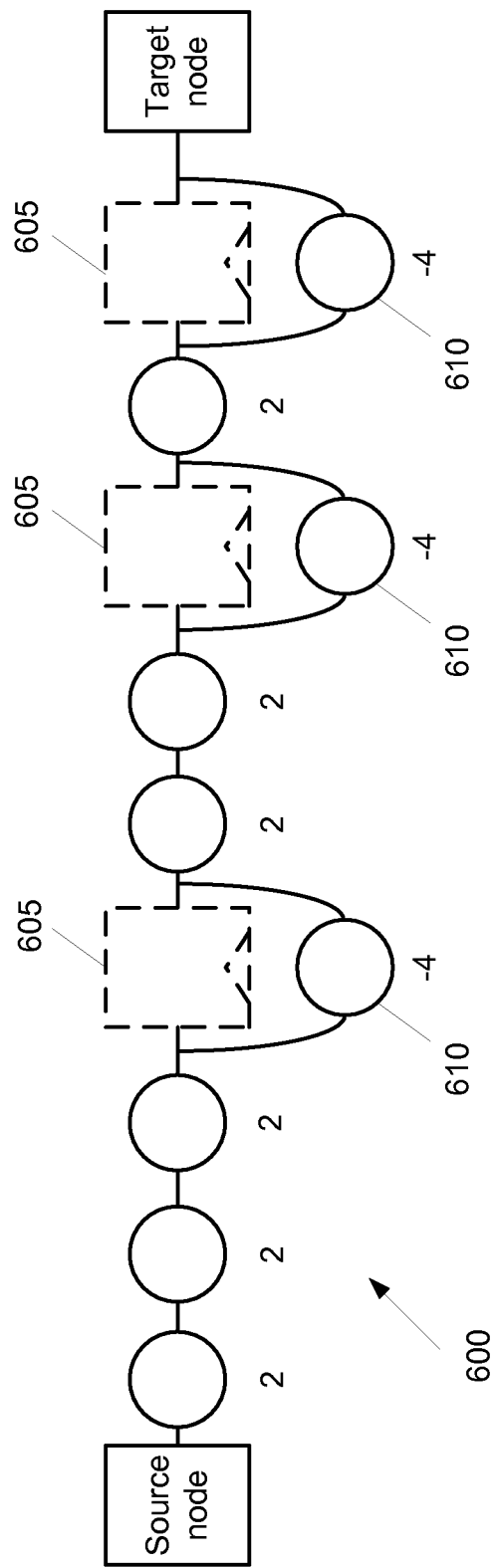
FIG. 6 illustrates a path in which clocked elements are conceptually replaced with non-computational elements with negative delays.

Sequential delay computation is similar to combinational delay computation, except sequential delay computation accounts for paths that can go through clocked elements. FIG. 6 illustrates a path 600 in some embodiments. This path is similar to path 300. As shown in FIG. 6, the clocked elements 605 are conceptually replaced by non-computational elements 610 with a negative delay equal to one clock period which accounts for the fact that the required time between two adjacent clocked elements (or a clocked element and an adjacent primary input or output) is one clock period. In FIG. 6, the delays associated with each node are shown under each node. In some embodiments, a path can also start from or end to a clocked element that cannot be retimed. In these embodiments, the outputs of the clocked elements that cannot be retimed are considered to occur at time zero.

FIG. 7 illustrates the results of sequential delay computation for path 600 shown in FIG. 6. Process 400, shown in FIG. 4 (which was discussed in reference to computing combinational delays) is also utilized to compute sequential delays. For the example of FIG. 7, process 400 identifies (at 400) node 705 as the source node and node 710 as the target node. The process does not identify any of the clocked elements as source or target nodes. In other words, the delays are not reset to zero after each clocked element. Instead a delay equal to one clock period is subtracted from the accumulated delay to account for each clocked element. Specifically, process 400 sets (at 410) the accumulated delay for the source node 705 to 0.

Next, the delays are accumulated (at 415) through the clocked elements. Since clocked elements are assigned negative delays, the effect of each clocked element is subtraction of one clock period from the accumulated delay. The delay is accumulated until the target node 710 is reached. The results of these computations for each node are shown on top of the nodes in FIG. 7.

Figure 8:
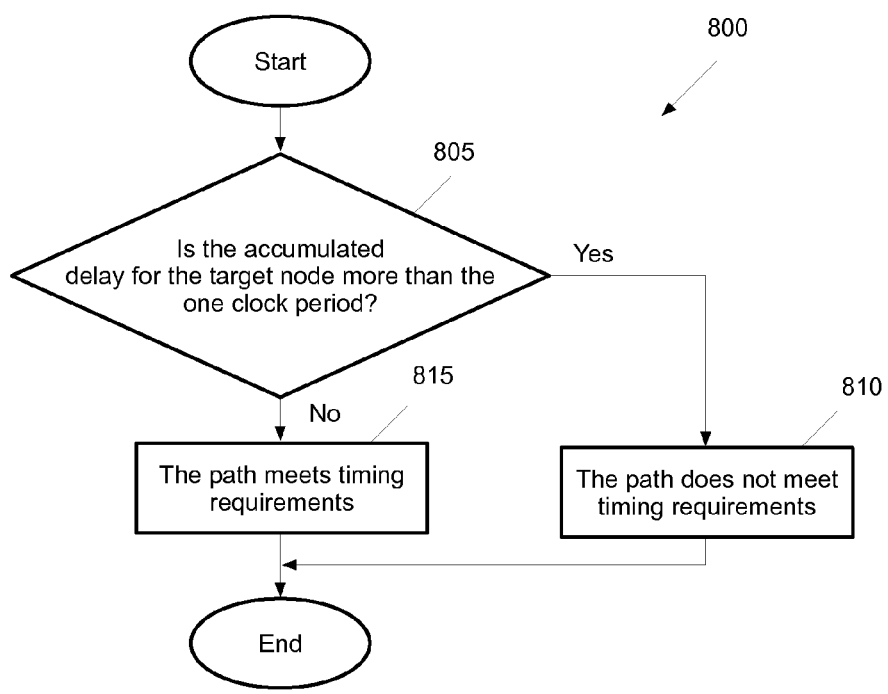
FIG. 8 conceptually illustrates a process that utilizes sequential delay computation to determine whether a path has met its timing requirements in some embodiments.

FIG. 8 illustrates a process 800 that utilizes sequential delay computation to determine whether a path meets its timing requirements. As shown, the process determines (at 805) whether the accumulated delay of the target node is more than one clock period. When the accumulated delay of the target node is more than one clock period, the process determines (at 810) that the path from the source node to the target node cannot meet its timing requirements with the given clock period. On the other hand, when the accumulated delay of the target node is less than or equal to one clock period, the process determines (at 815) that the path can meet its timing requirements.

For instance, in FIG. 7, the accumulated delay of the target node 710 is zero. This accumulated delay is the sequential delay of path 700 that starts from the source node 705 and ends to the target node 710. The sequential delay being less than one clock period indicates that there exists a retiming of the clocked elements such that all elements meet their required timing. In the example of FIG. 7, since the accumulated delay for the target node is zero and the clock period is 4 time units, the path 700 can be retimed by moving the clocked elements across the path until the path meets its timing requirement.

C. Retiming

FIG. 9 illustrates the retiming of path 700 shown in FIG. 7 to make the path meet its timing requirements. In this example, the timing requirements are met when every path that either (1) starts from a clocked element and ends to a clocked element, (2) starts from a timed element and ends to a clocked element, or (3) starts from a clocked element ends to a timed element, without encompassing any other clocked elements meets its timing requirements (i.e., the arrival time of a signal at a target node is less than or equal to its required time).

As shown in FIG. 9, clocked element 725 which was originally between computational elements 725 and 730 is retimed to be between computational elements 715 and 720. In effect this clocked element is moved to an earlier point in time. As a result, the path between the source node 705 and clocked element 725 will have one computational element. Similarly, clocked element 740 that was originally between computational elements 735 and 745 is moved between computational elements 725 and 730. As a result the path between clocked elements 725 and 740 includes two computational elements. Further, clocked element 750 that was between computational element 745 and the target node 710 is moved between computational elements 730 and 735. As a result, the path between clocked element 750 and the target node 710 includes two computational elements.

Utilizing process 400, the combinational delays for the elements of the four paths (705 to 725, 725 to 740, 740 to 750, and 750 to 710) are computed and the results are displayed on top of each element. These four paths are the paths between two clocked elements or a clocked element and a non-clock timed element. None of the paths encompasses another clocked element other than the source and/or the target nodes.

Utilizing process 500, combinational delays are compared with required times for the signals to get from source to target nodes in each path. As shown in FIG. 9, when the combinational delay computations are compared with the required times for each target node, the timing requirements for all target nodes (725, 740, 750, and 710) are met. Since every path between two clocked elements or between one clocked element and the source or target nodes meets its timing requirement, the overall path 700 also passes the timing requirements (i.e., the path can be performed using the current clock period).

IV. Placement Engines that Perform Timing Analysis

Figure 10:
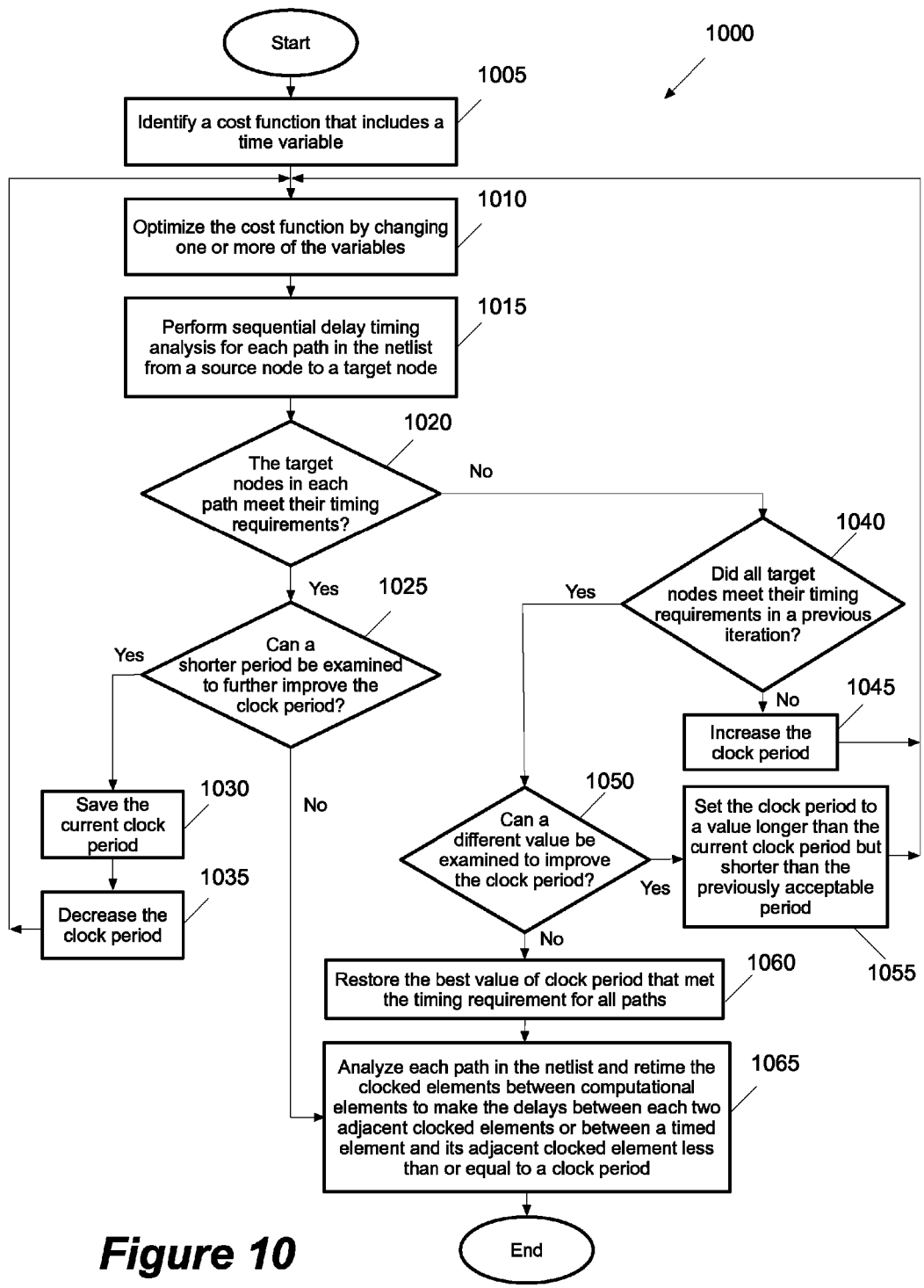
FIG. 10 conceptually illustrates a process performed by a placement engine to do timing analysis using sequential delay computations.

In some embodiments, the timing analysis is performed by the placement engine while the placement engine is optimizing other costs (such as wiring lengths and congestion) of the netlist. However, calculating sequential delays can be very time consuming. FIG. 10 illustrates a process 1000 that computes sequential delays and performs timing analysis for the netlist. As shown, the process identifies (at 1005) a cost function to optimize during placement operation. The cost function includes a time variable to optimize. The cost function also includes one or more other variables such as wiring length and congestion to optimize.

Next, the process optimizes (at 1010) the cost function by changing one or more of the variables. Next, the process performs (at 1015) sequential delay timing analysis for each path from a source node to a target node in the netlist. These paths can go through clocked elements. The process then determines (at 1020) whether the target nodes in each path meet their timing requirements. When at least one target does not meet the timing requirements, the process proceeds to 1040 which is described below.

Otherwise, the process determines (at 1025) whether a shorter clock period can be examined to further improve the clock period. The process may utilize a binary search to find shorter values for clock period until a clock period acceptable by the circuit design is reached or the clock period cannot be improved any further. When the process determines that the clock period cannot be improved any further, the process proceeds to 1065 which is described below. Otherwise, the process saves at 1030) the current clock period as a clock period that has met the timing requirements. Next, the process decreases (at 1035) the clock period and proceeds to 1010 which was described above.

When the test at 1020 fails, the process determines (at 1040) whether all target nodes had met their timing requirements in a previous iteration. If not, the process increases (1045) the clock period and proceeds to 1010 that was described above. The process may utilize a binary search to find the next value for the clock period.

After 1040, when the process determines that all target nodes have met the timing requirements, the process determines (at 1050) whether a different clock period can be examined to further improve the clock period. Although the current clock period satisfies the timing requirements of all target nodes, some circuit designs may set a goal of further improving the clock period until a certain number of iterations are performed, the clock period becomes smaller than a certain value, the improvement in the clock period becomes negligible after certain number of iterations, or other criteria is met.

When (after 1050) the process determines that the clock period can be further improved, a new clock period which is longer than the current clock period but shorter than the previously acceptable period is selected (at 1055). The process then proceeds to 1010 that was described above.

On the other hand, when (after 1045) the process determines that the clock period cannot be improved any further, the process restores (at 1060) the best value of the clock period that met the timing requirements in a previous iteration. Finally, the process analyzes (at 1065) each path in the netlist and retimes the clocked elements between computational elements to make the delays between each two adjacent clocked elements or between each timed element and its adjacent clocked elements less than or equal to a clock period. As shown in FIG. 10, the process has to repeatedly calculate sequential timing analysis for each path in the netlist to determine whether the timing requirements are met or whether a shorter clock period can be identified.

A. Failing Loops

Figures 11, 12:
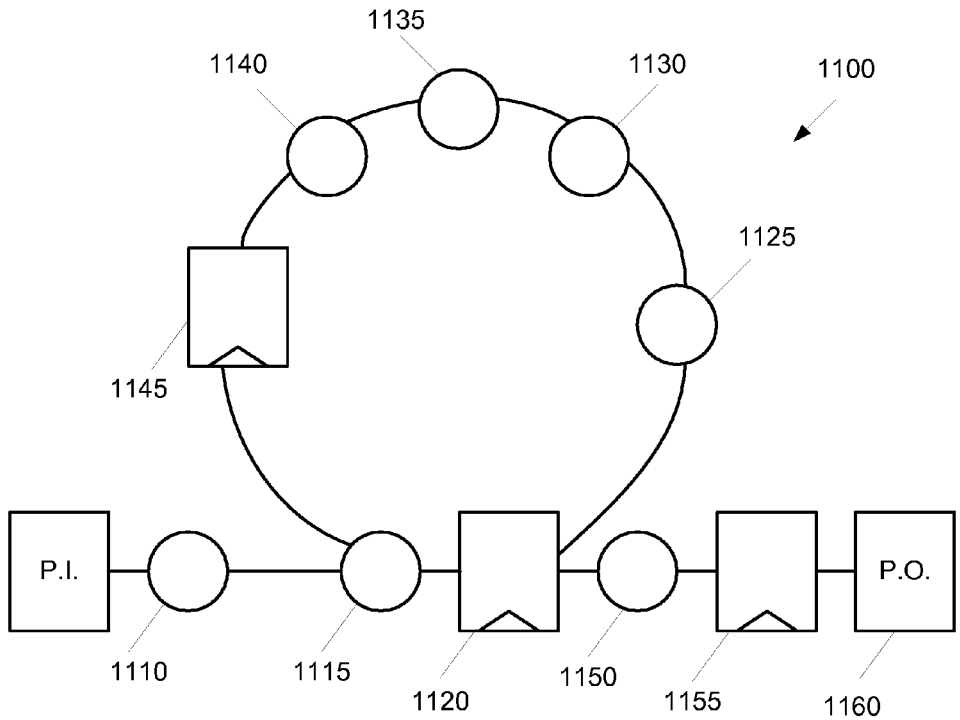
FIG. 11 illustrates an example of problems with calculation of sequential delay in a circuit with a failing loop.
FIG. 12 illustrates a table that shows the results of several iterations of sequential delay calculations for FIG. 11.

Sequential delay computation is an expensive computation. When a netlist includes a loop and the clock period is relatively small, the sequential delay computation for the given clock period may not converge. FIG. 11 illustrates an example of a netlist 1100 with such a failing loop. As shown, computational element 1115 receives two inputs. One input from computational element 1110 and another input from clocked element 1145. The sequential delay of node 1115 is the maximum sequential delay of its inputs plus the computational delay of computational element 1115. In the example of FIG. 11, the clock period is assumed to be four time units and all computational elements are assumed to have a delay of two time units.

Utilizing process 400, an initial value for the sequential delays of the nodes in netlist 1100 is computed. FIG. 12 illustrates a Table 1200 that shows the results of sequential delay computations after several iterations. Initially, the sequential delay of node 1145 is not known. Therefore, the sequential delay for node 1115 is computed as the total of two time units for node 1110 delay and two time units for node 1115 delay. The results of the initial computation for sequential delays of the nodes in netlist 1100 are shown in Table 1200. As shown, after the initial iteration, the sequential delay of node 1145 is computed to be four time units. The sequential delay of node 1115 can now be updated to be four time units (which is the maximum delay of its input paths) plus two time units (which is the delay attributed to the node itself and its associated wiring).

After all sequential delays are updated node 1145 will have a sequential delay of six time units as shown for the second iteration in Table 1200. This new value of delay for 1145 results in an updated value of eight time units for the sequential delay of node 1115 in the third iteration. As shown in Table 1200, the sequential delay values do not converge for the given clock period. The value of the clock period has to be increased in order for the sequential delay values to converge. In a complicated netlist in which loops are not easily detectable, the sequential delay computation will be very time consuming and will take a long time to find an appropriate value of clock period for which all sequential delays converge.

B. Timing Driven Placement Engines that Assign Event Times to Nodes in the Netlist Typically, placement engines model the netlist by assigning a horizontal and a vertical coordinate (x and y location) to each node in the graph. In some embodiments, a new dimension is added to the placement engine by assigning an event time to each node in the netlist. In these embodiments, the placement engine performs a three dimensional placement.

Figure 13:
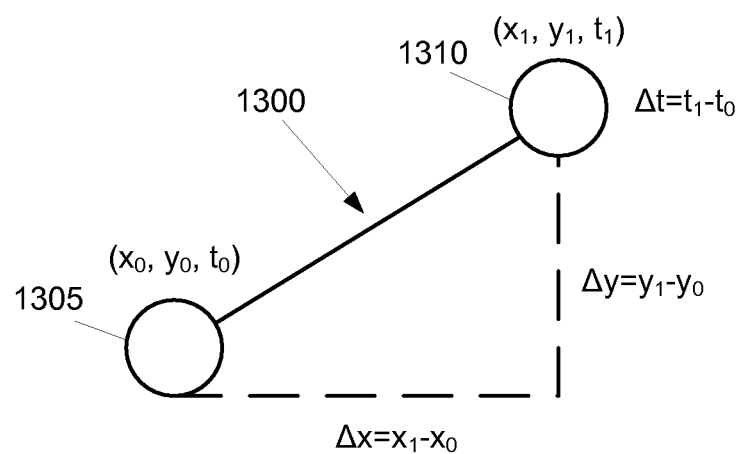
FIG. 13 illustrates a path with a source and a target node in some embodiments.

FIG. 13 illustrates an edge 1300 between a source node 1305 and a target node 1310. In FIG. 13, in addition to the horizontal and vertical coordinates of a node, the placement engine has assigned an event time to each node. In some embodiments, the event time of a node is the arrival time of the signal to the node. In some embodiments, the event time of a node is the time a stable output signal is available at the output of the node. As shown, the source node 1305 is represented by three space-time values ($x_0$, $y_0$, $t_0$) and the target node 1310 is represented by three space-time values ($x_1$, $y_1$, $t_1$). The placement engine will optimize the functions of $\Delta x$, $\Delta y$, and $\Delta t$.

Figure 14:
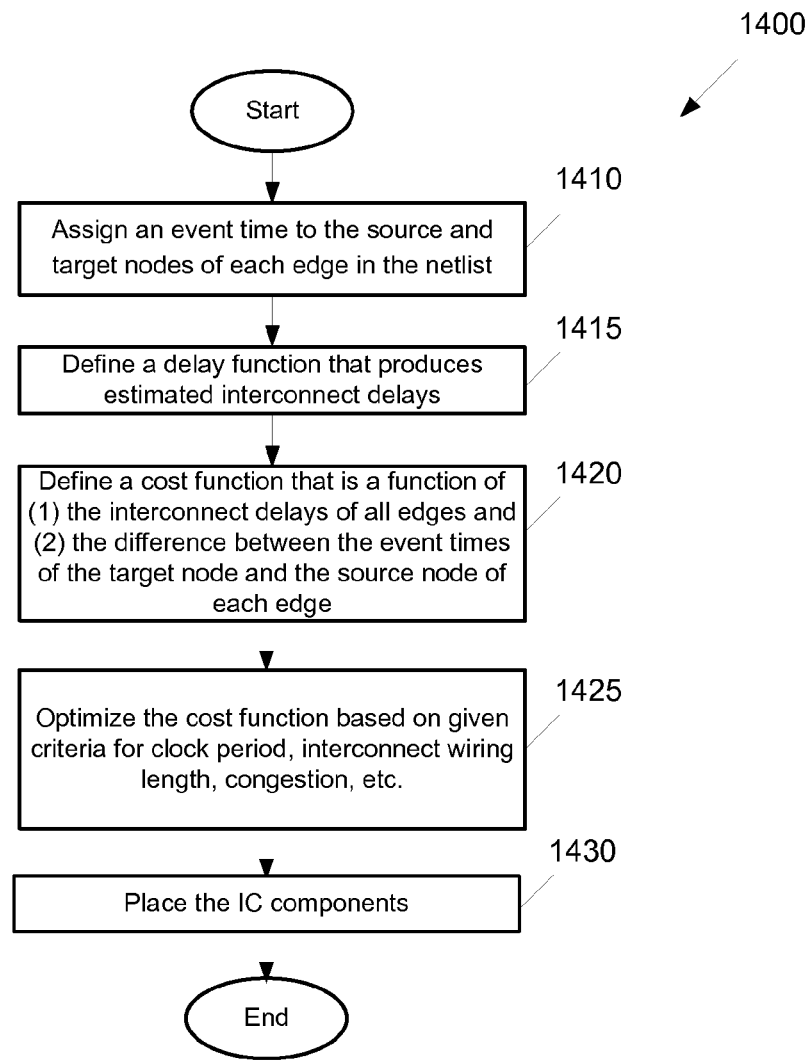
FIG. 14 conceptually illustrates a process performed by a placement engine to do timing analysis in some embodiments.

FIG. 14 conceptually illustrates a process 1400 utilized by a placement engine of some embodiments to perform timing analysis using assigned event times. As shown, the process assigns (at 1410) an event time to the source and target nodes of each edge in the netlist. As described above, each node will be represented by three variables x, y, and t representing horizontal coordinate, vertical coordinate, and time respectively. Next, the process defines a delay function that produces estimated interconnect delays. In some embodiments, the delay function for an edge is represented as $d(\Delta x, \Delta y)$, where $\Delta x$ and $\Delta y$ are the differences between the horizontal and vertical coordinates of the target and source nodes of the edge as shown in FIG. 13.

Next, the process defines (at 1420) a cost function for the netlist. In some embodiments, the cost function is a function of the interconnect delays and the event times of the source and target nodes. In these embodiments, the cost function is expressed by the following equation (B):

$$\Sigma_{edges,i} fn(\Delta t_i, d(\Delta x_i, \Delta y_i)) \quad (B)$$

where for each edge, i, $\Delta t_i$ is the difference between the event times of the target and the source nodes; $\Delta x_i$ is the difference between the x coordinates of the target and the source nodes; and $\Delta y_i$ is the difference between the y coordinates of the target and the source nodes.

Finally, the process optimizes (at 1425) the cost function based on given criteria for clock period, interconnect wiring length, congestion, etc. The process places (at 1430) the IC components after timing requirements are met. The placement meets timing requirements when:

$$\Sigma_{edges,i}(\Delta t_i \geq d(\Delta x_i, \Delta y_i)) \quad (C)$$

where for each edge, i, $\Delta t_i$ is the difference between the event times of the target and the source nodes and $d(\Delta x_i, \Delta y_i)$ is the delay function for edge i.

Since the cost function in equation (B) is based on edges of the graph, when the placement engine changes the event time of a particular node to optimize the cost function, only the time difference, $\Delta t$, for the edges that start or end on that particular node are affected. The placement engine does not have to recalculate the delays throughout the netlist.

C. Timing Driven Placement Engines that Compute Sequential Delays

Figure 15:
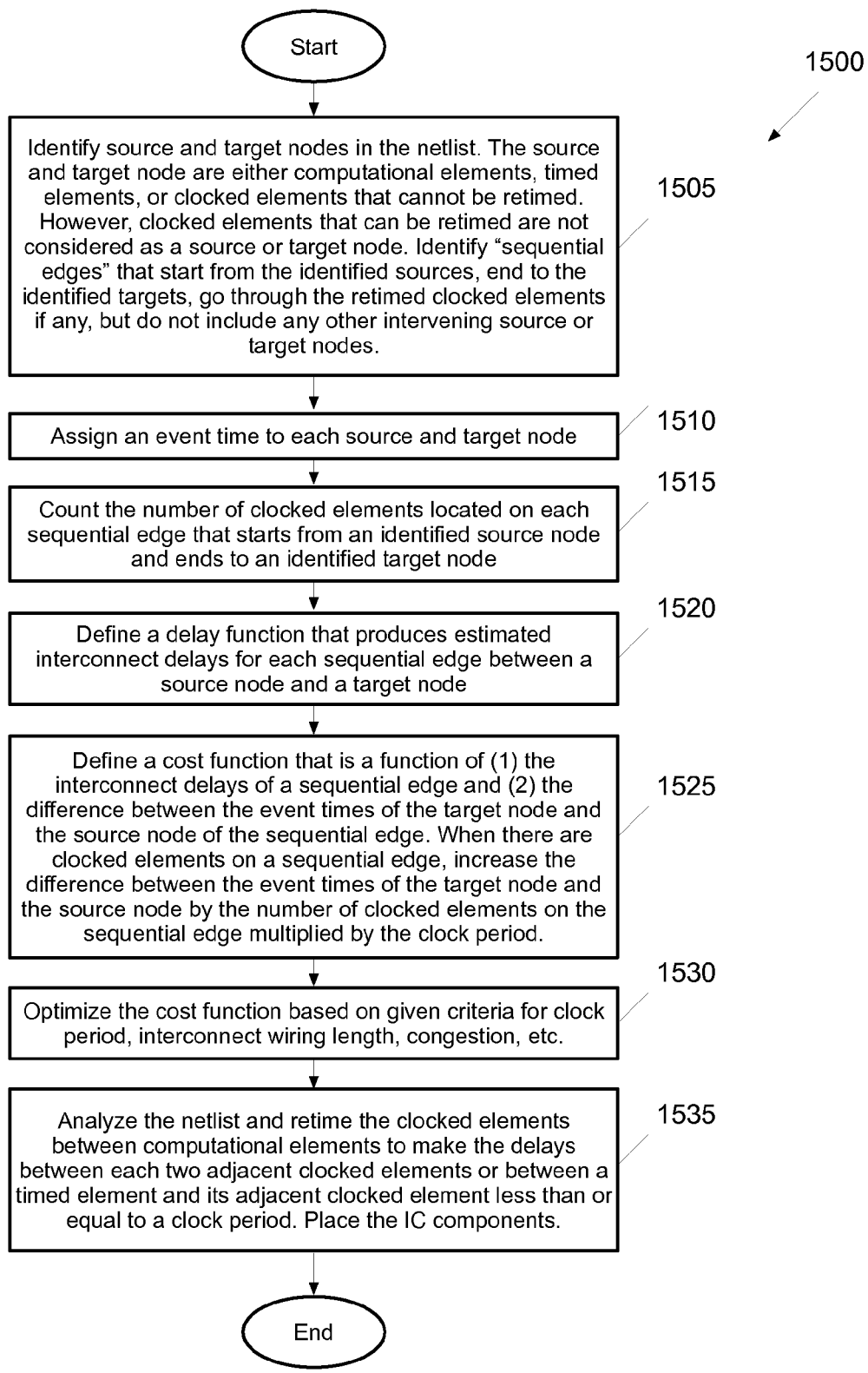
FIG. 15 illustrates a process that conceptually shows timing analysis performed by a placement engine in some embodiment using sequential delay calculation.

In some embodiments, the placement engine performs sequential delay computation as a part of its timing analysis. FIG. 15 conceptually illustrates a process 1500 utilized by placement engine of some embodiments for performing sequential delays computation for a netlist. As shown, the process identifies (at 1505) source nodes and target nodes in the netlist. The process selects computational elements and timed elements as source and target nodes. In some embodiments, the process also identifies clocked elements that cannot be retimed as the source and target nodes. However, the process does not consider retimable clocked elements as source or target nodes. The process then identifies "sequential edges" which are paths that go from a source, through these unconsidered clocked elements, ending at a target. The sequential edges do not include any other intervening source or target nodes.

Next, the process assigns (at 1510) an event time to each source and target node which is on a sequential edge. As described above, in some embodiments each node is represented by three variables x, y, and t representing horizontal coordinate, vertical coordinate, and time respectively. In some embodiments, the event times are absolute values given from a time when the execution of the netlist will start during runtime.

Figure 16:
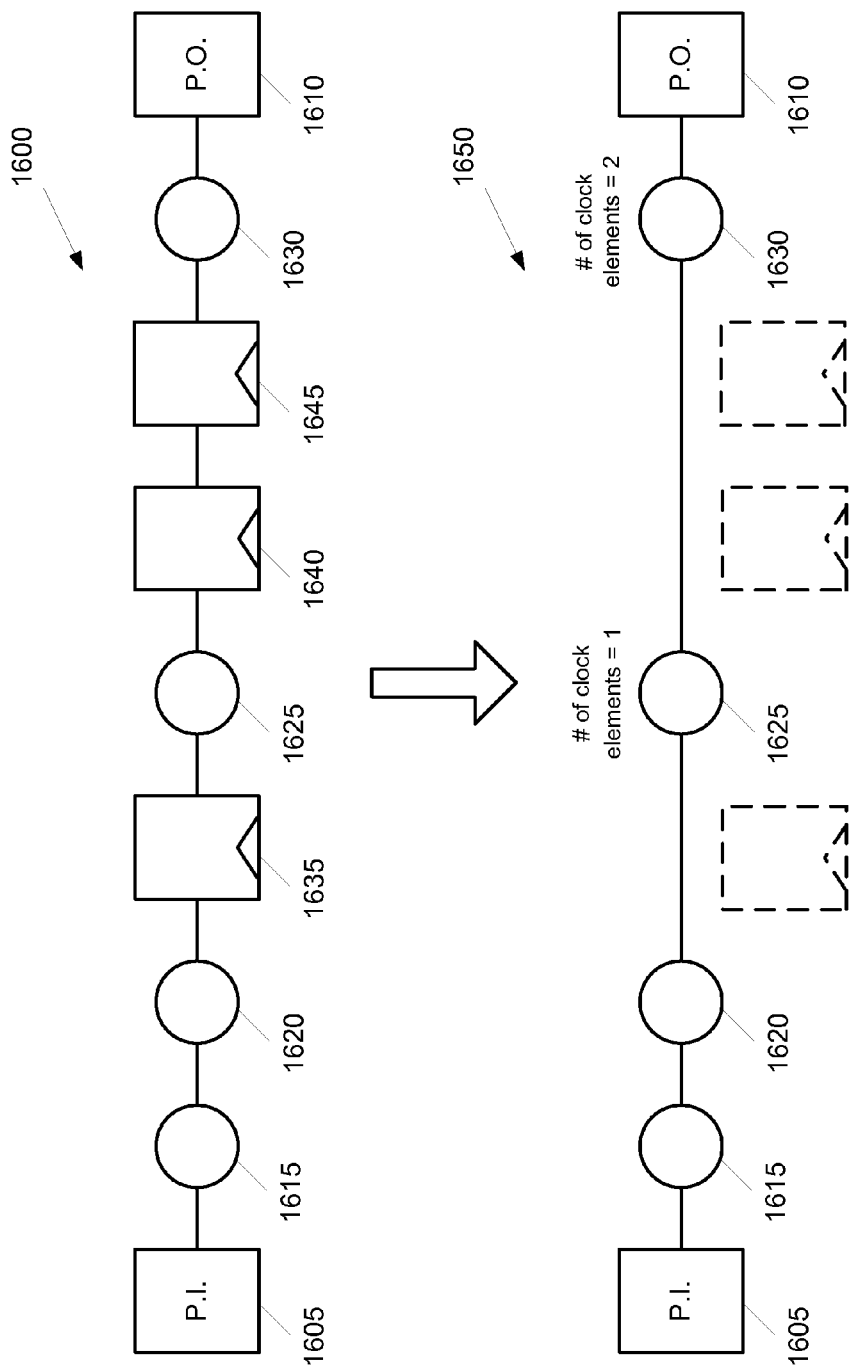
FIG. 16 illustrates conceptual removal of clocked elements from sequential edges in some embodiments to facilitate sequential delay calculation.

Next, the process counts (at 1515) the number of clocked elements located on each sequential edge. FIG. 16 illustrates a technique that some embodiments employ to count the number of clocked elements on each sequential edge. As shown, path 1600 starts from a source node 1605 and ends at a target node 1610. Path 1600 has four computational elements 1615-1630 and three clocked elements 1635-1645. In this example, the source and target nodes are a primary input 1605 and a primary output 1610 respectively. As shown, path 1600 includes several smaller paths. Each one of these paths starts from a timed element or a computational element as the source node and ends to the next immediate timed element or computational element as the target node. For instance, the path from 1605 to 1615 is between a primary input and a computational element and the path from 1625 to 1640 is between a computational element and a clocked element.

In some embodiments, a placement engine conceptually transforms a path such as 1600 to a path such as 1650 in which the clocked elements are not considered as source or target nodes of the smaller paths. Instead, in path 1650, the smaller paths are sequential edges that start from either timed elements (other than retimable clocked element) or computational elements as source nodes and end to the next timed element (other than a retimable clocked element) or computational element. In other words, the sequential edges are allowed to go through the retimable clocked elements. The number of clocked elements on each sequential edge is counted and is used in computation of sequential delay as indicated further below. For example, the sequential edge between computational elements 1620 and 1625 goes through one clocked element while the sequential edge between computational elements 1625 and 1630 goes through two clocked elements. The number of clocked elements (when more than zero) are shown on top of each node in FIG. 16.

Referring back to FIG. 15, the process defines (at 1520) a delay function that produces estimated interconnect delays. In some embodiments, the delay function for a sequential edge is represented as $d(\Delta x, \Delta y)$, where $\Delta x$ and $\Delta y$ are the difference between the horizontal and vertical coordinates of the target and source nodes of the sequential edge.

Next, the process defines (at 1525) a cost function for all sequential edges in the netlist. In some embodiments, the cost function for a sequential edge is a function of (1) the interconnect delay, $d(\Delta x, \Delta y)$, of the sequential edge and (2) the difference between the event times of the source and target nodes of the sequential edge. In these embodiments, the cost function is expressed by the following equation (D):

$$\Sigma_{sequential\ edges,i} fn(\Delta t_i, d(\Delta x_i, \Delta y_i)) \qquad (D)$$

where $\Delta x_i$ is the difference between the x coordinates of the target and the source nodes, $\Delta y_i$ is the difference between the y coordinates of the target and the source nodes, and $\Delta t_i$ is the difference between the event times of the target and the source nodes.

However, when there are retimable clocked elements on a sequential edge, the difference between the event times of the target node and the source node of the edge is increased by the number of clocked elements on the edge multiplied by the clock period. The cost function is, therefore, expressed by the following equation (E):

$$\Sigma_{sequential\ edges,i} fn((\Delta t_i + (\# \text{ of clock elements on the sequential edges*clock period})), d(\Delta x_i, \Delta y_i)) \qquad (E)$$

Next, the process optimizes (at 1530) the cost function based on given criteria for clock period, interconnect wiring length, congestion, and other optimization criteria. The process analyzes (at 1535) the netlist and moves the clocked elements (if necessary) between the computational elements to make the delays between each two adjacent clocked elements less than or equal to a clock period. Finally, the process places the IC components.

D. Placement Engines for Reconfigurable ICs

The embodiments disclosed in previous sections are applicable to any kind of ICs such as application-specific integrated circuits (ASICs), structured ASICs, field-programmable gate arrays (FPGAs), programmable logic devices (PLDs), complex programmable logic devices (CPLDs), system on chips (SOCs), system-in-packages (SIPs), reconfigurable ICs (e.g., space-time machines), etc. The embodiments disclosed in this section are applicable to reconfigurable ICs and the reconfigurable portions of SOCs, SIPs, etc. As described below, some embodiments are implemented to perform placement for reconfigurable ICs. In some embodiments with a sub-cycle reconfigurable IC, the placement engine determines which sub-cycle each computational element falls into.

Figure 17:
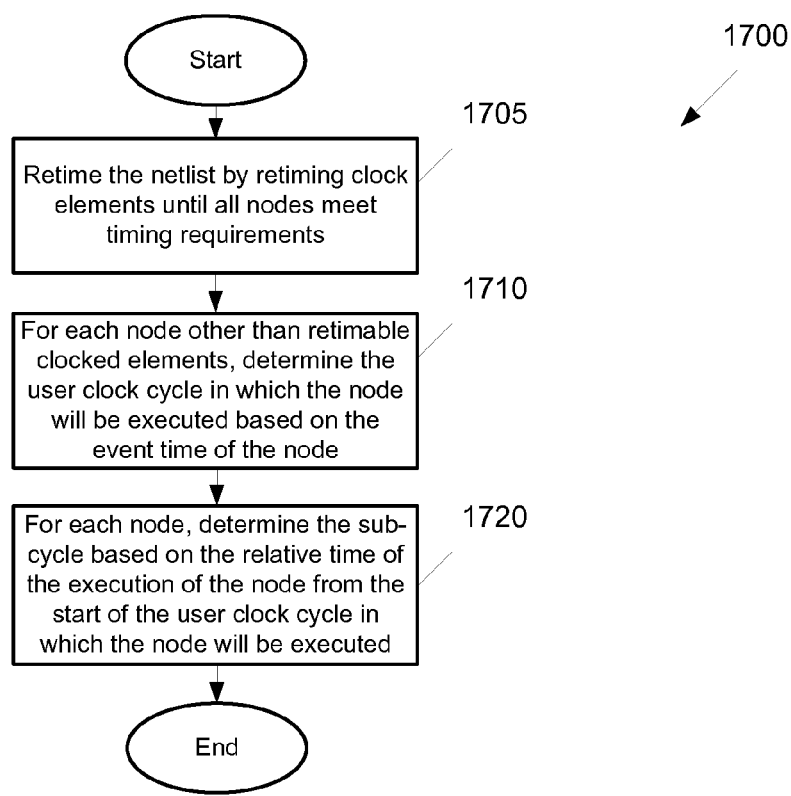
FIG. 17 conceptually illustrates a process that identifies a sub-cycle for performing each computational element in a netlist in some embodiments.
Figure 18:
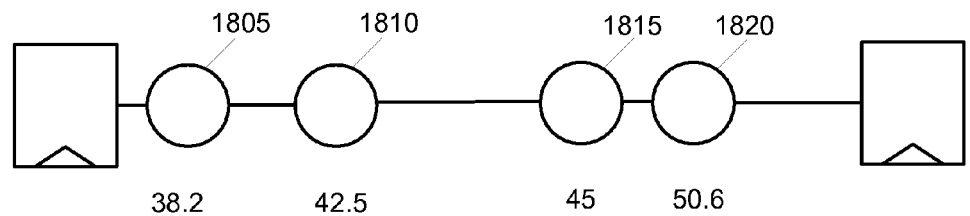
FIG. 18 illustrates a path with event times assigned to computational elements of a reconfigurable IC in some embodiments.

FIG. 17 conceptually illustrates a process 1700 that determines which sub-cycle a computational element falls into. As shown, the process retimes (at 1705) the netlist by retiming clocked elements until all nodes meet their timing requirements. In some embodiments, the process uses one of the techniques described above to perform the retiming operation.

Next, for each node other than a retimable clocked element, the process determines (at 1710) the user clock cycle in which the element will be executed during the operation of the IC. In some embodiments, the placement engine determines the cycle for the node by performing the following equation (F):

user cycle in which a node is executed=event time of
the node\clock period (F)

where \ denotes an integer division and the event time of the node is measured in absolute time. Next, the process determines (at 1720) the particular sub-cycle in which the node will be executed by determining the relative time from the beginning the user cycle and the time the node is executed. In some embodiments, the placement engine determines the relative time from the beginning of the user cycle by performing the following equation (G):

execution time of the node relative to the beginning of
the user clock cycle=the event time of the node
Modulo clock period (G)

In some embodiments equations (F) and (G) are part of the same integer division operation. The operation divides the event time of the node by the clock period where the quotient is shown in equation (F) and the remainder is shown in equation (G).

FIGS. 18-21 illustrate an example of assignment of sub-cycles to computational elements of a netlist in some embodiments. The clock period is assumed to be eight time units. As shown, the event time of node 1805-1820 are assigned by the placement engine to be 38.2, 42.5, 45, and 50.6 units of time. The event times are given in absolute values starting from a time when the execution of the netlist will begin during runtime.

Figure 19:
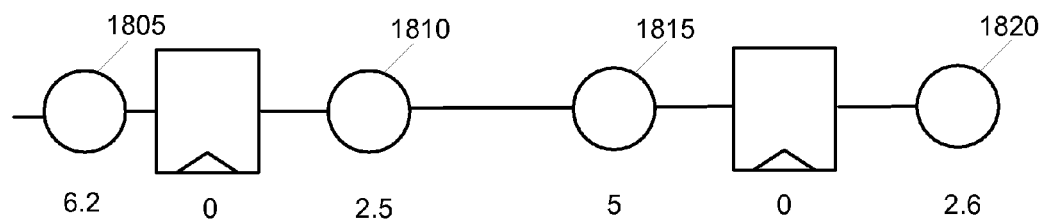
FIG. 19 illustrates the path of FIG. 18 after certain computational elements are moved to other operational cycles.

FIG. 19 illustrates the user cycles to which each one of nodes 1805-1820 are assigned after performing equation operations (F) and (G). The execution time of each node is normalized relative to the beginning of the user cycle. The placement engine assigns node 1805 to 6.2 time units from the start of user cycle four (integer division of 38.2 by 8 results in a quotient of 4 and a remainder of 6.2). The placement engine assigns nodes 1810 and 1815 to 2.5 and 5 time units from the start of user cycle five (integer division of 42.5 and 45 by 8 results in a quotient of 5 and remainders of 2.5 for 1810 and 5 for 1815). Finally, node 1820 is assigned to 2.6 time units from the start of user cycle six (integer division of 50.6 by 8 results in a quotient of 6 and a remainder of 2.6).

Figure 20:
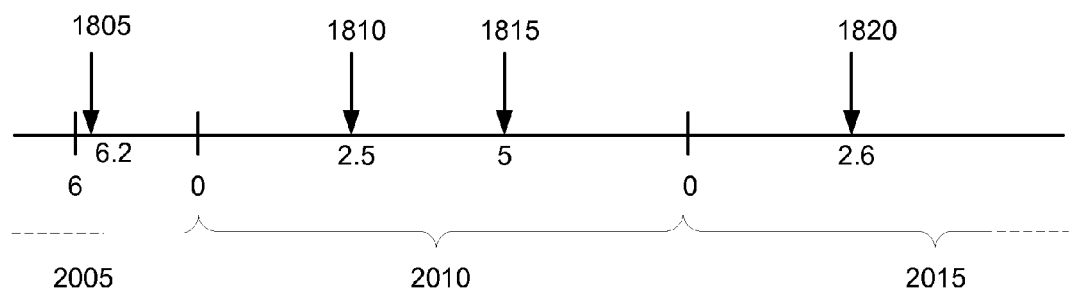
FIG. 20 illustrates a timeline for performing computational elements of FIG. 19.

FIG. 20 illustrates a time line that shows placements of nodes 1805-1820. As shown, node 1805 is placed in user cycle four 2005, nodes 1810-1815 are placed in user cycle five 2010, and node 1820 is placed in user cycle six 2015.

Figure 21:
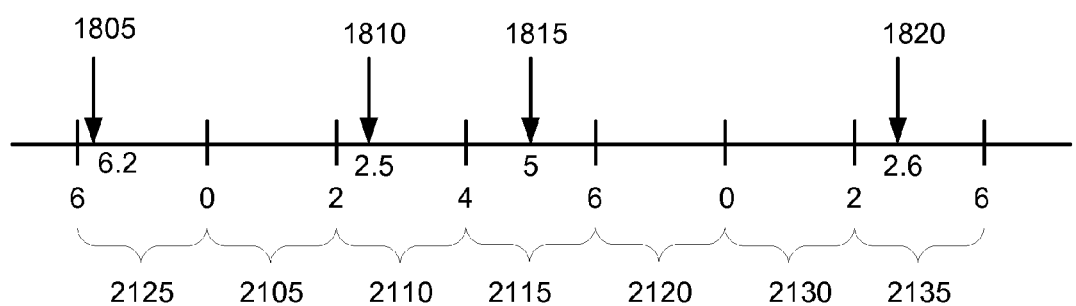
FIG. 21 illustrates a timeline for performing computational elements of FIG. 19.

FIG. 21 illustrates a time line that shows the assignment of nodes 1805-1820 to sub-cycles for a reconfigurable IC in which the user clock has four sub-cycles. The four sub-cycles of user cycle five are sub-cycles 2105-2120. This user cycle precedes by another cycle which also has four sub-cycles (only the last sub-cycle 2125 is shown). Also as shown, user cycle five is followed by another cycle that also has four sub-cycles (the first two sub-cycles 2130-2135 are shown). As shown, node 1805 is assigned to the last sub-cycle 2125 of the user cycle four.

Similarly, node 1820 is assigned to the second sub-cycle 2135 of the user cycle six, as shown in FIG. 21. The other two nodes 1810 and 1815 are assigned to user cycle five. The relative times of these nodes from the start of user cycle five places node 1810 in sub-cycle two 2110 and node 1815 in sub-cycle three 2115 of user cycle five, as shown.

V. Electronics System

Figure 22:
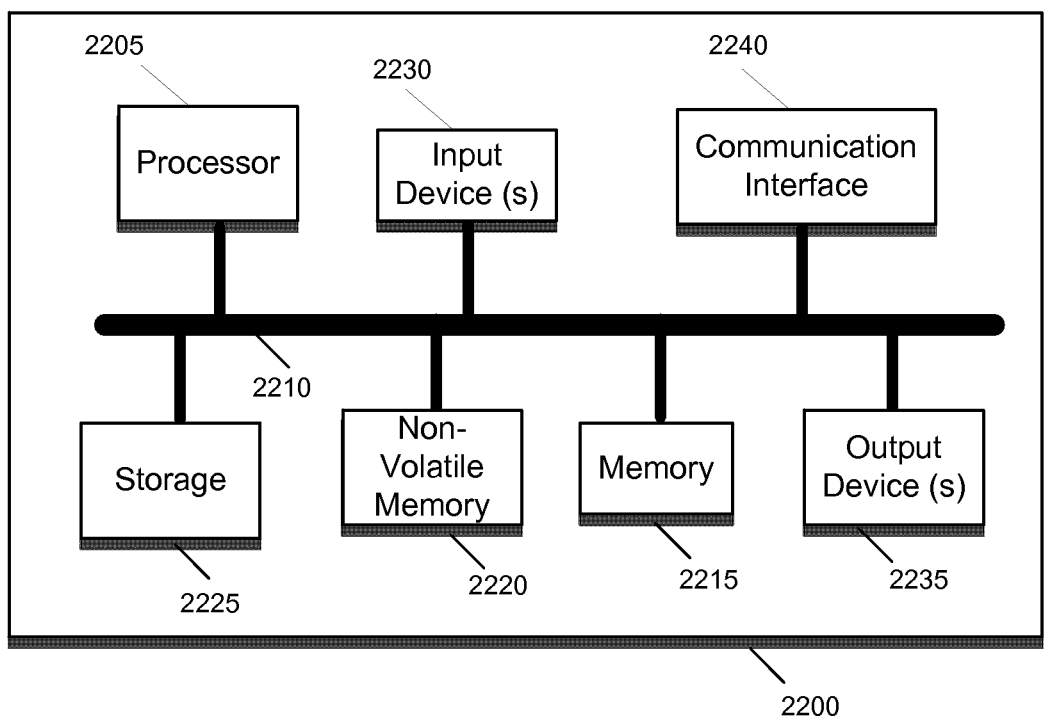
FIG. 22 illustrates an electronics system with which some embodiments of the invention are implemented.

FIG. 22 conceptually illustrates a more detailed example of an electronics system 2200 that implements some of the above described inventions. The system 2200 can be a stand-alone computing device, or it can be part of another electronic device. As shown in FIG. 22, the system 2200 includes a processor 2205, a bus 2210, a system memory 2215, a non-volatile memory 2220, a storage device 2225, input devices 2230, output devices 2235, and communication interface 2240. In some embodiments, the non-volatile memory 2220 stores configuration data and re-loads it at power-up.

The bus 2210 collectively represents all system, peripheral, and chipset interconnects (including bus and non-bus interconnect structures) that communicatively connect the numerous internal devices of the system 2200. For instance, the bus 2210 communicatively connects the processor 2205 with the non-volatile memory 2220, the system memory 2215, and the permanent storage device 2225.

From these various memory units, the processor 2205 receives data for processing and retrieves from the various memory units, instructions to execute. The non-volatile memory 2220 stores static data and instructions that are needed by the processor 2205 and other modules of the system 2200. The storage device 2225 is read-and-write memory device. This device is a non-volatile memory unit that stores instruction and/or data even when the system 2200 is off. Like the storage device 2225, the system memory 2215 is a read-and-write memory device. However, unlike storage device 2225, the system memory is a volatile read-and-write memory, such as a random access memory. The system memory stores some of the instructions and/or data that the processor 2205 needs at runtime.

The bus 2210 also connects to the input and output devices 2230 and 2235. The input devices enable the user to enter information into the system 2200. The input devices 2230 can include touch-sensitive screens, keys, buttons, keyboards, cursor-controllers, microphone, etc. The output devices 2235 display the output of the system 2200.

Finally, as shown in FIG. 22, bus 2210 also couples system 2200 to other devices through a communication interface 2240. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

Some embodiments include electronic components, such as microprocessors, storage, and memory that store computer program instructions (such as instructions for performing operations of a placement engine) in a machine-readable or computer-readable medium. Examples of machine-readable media or computer-readable media include, but are not limited to magnetic media such as hard disks, memory modules, magnetic tape, optical media such as CD-ROMS and holographic devices, magneto-optical media such as optical disks, and hardware devices that are specially configured to store and execute program code, such as application specific integrated circuits (ASICs), field-programmable gate arrays (FPGA), programmable logic devices (PLDs), ROM, and RAM devices. Examples of computer programs or computer code include machine code, such as produced by a compiler, and files including higher-level code that are executed by a computer, an electronic component, or a microprocessor using an interpreter.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed:

1. A method of designing an integrated circuit (IC), the IC design expressed as a graph comprising a plurality of edges and a plurality of nodes representing a plurality of IC components, each edge connecting two nodes without encompassing a third node, the method comprising:

defining a cost function that has a component for each edge that is based on (i) a spatial relationship comprising a difference in horizontal and vertical coordinates of the two nodes of the edge and (ii) a temporal relationship comprising a difference between event times of the two nodes of the edge;

optimizing, by a computer, the IC design by changing at least one of an event time and a coordinate of a node and modifying the IC design to satisfy a set of constraints on each component of the cost function such that, for each edge, a difference between the event times of the nodes connected by the edge is not less than a signal propagation delay caused by the spatial relationship between the two nodes connected by the edge; and placing the IC components based on the optimized IC design.

2. The method of claim 1, wherein the IC includes at least one reconfigurable circuit that reconfigures during an operation of the IC.

3. The method of claim 2, wherein at least one reconfigurable circuit is for reconfiguring at a first clock rate that is faster than a second clock rate specified for a particular design of the IC.

4. The method of claim 3, wherein the second clock comprises a clock cycle comprising a plurality of sub-cycles, wherein placing the IC components comprises assigning each node in the second set of nodes to a particular sub-cycle of the second clock.

5. A method of designing an integrated circuit (IC), wherein the IC design is expressed as a graph comprising a plurality of edges and a plurality of nodes representing a plurality of IC components, each edge connecting two nodes without encompassing a third node, the method comprising:

assigning an event time to each node in the graph, each event time associated with availability of a signal at a corresponding node;

defining a cost function that has a cost expression for each edge that is based on the event times of the nodes connected by the edge and a spatial distance between the nodes connected by the edge, wherein the spatial distance is based on horizontal and vertical coordinates of the two nodes of the edge;

identifying, by a computer, a placement solution for the IC components by changing at least one of an event time and a coordinate of a node in the cost function and modifying the IC design to satisfy a set of constraints on each component of the cost function such that, for each edge, a difference between the event times of the nodes connected by the edge is not less than a signal propagation delay caused by the spatial relationship between the two nodes connected by the edge; and placing the IC components based on the identified placement solution.

6. The method of claim 5, wherein the placement solution is identified by changing at least one of an event time and a coordinate of a node.

7. The method of claim 5, wherein the IC is one of an application-specific integrated circuit (ASIC), a structured ASIC, a field-programmable gate array (FPGA), a programmable logic device (PLD), a complex programmable logic device (CPLD), a system on chip (SOC), a system-in-package (SIP), and a reconfigurable IC.

8. The method of claim 5, wherein the identified placement solution meets a timing requirement on the cost expression of the cost function for each edge such that a difference between the event times of the nodes connected by the edge is not less than a signal propagation delay caused by the spatial distance.

9. A method of designing an integrated circuit (IC), wherein the IC design is expressed as a graph comprising a plurality of nodes representing a plurality of IC components, the plurality of nodes comprising a first set of nodes representing a set of clocked elements, the method comprising:

identifying a second set of nodes that comprises nodes in the plurality of nodes that are not in the first set of nodes, the second set of nodes not comprising any node from the first set of nodes;

identifying a set of edges, each identified edge connecting two nodes in the second set of nodes while encompassing at least one node from the first set of nodes;

assigning an event time to each node in the second set of nodes;

defining a cost function that has a component for each edge that is based on (i) the event times of the two nodes connected by the edge, (ii) a spatial distance based on a difference in horizontal and vertical coordinates of the two nodes connected by the edge, and (iii) a number of nodes in the first set encompassed by the edge;

optimizing, by a computer, the IC design; and placing the IC components based on the optimized IC design by modifying the IC design to satisfy a set of constraints on each component of the cost function such that, for each edge, a difference between the event times of the nodes connected by the edge is not less than a signal propagation delay caused by the spatial relationship between the two nodes connected by the edge.

10. The method of claim 9, wherein optimizing the IC design comprises changing at least one of an event time and a coordinate of a node.

11. The method of claim 9, wherein the clocked elements represented by the first set of nodes are retimable clocked elements.

12. The method of claim 9, wherein the nodes in the second set comprise clocked elements that cannot be retimed.

13. The method of claim 9, wherein the nodes in the second set comprise input and output nodes of the graph.

14. The method of claim 9, wherein the nodes in the second set comprise nodes with timing constraints.

15. The method of claim 9, wherein the nodes in the second set comprise storage elements.

16. The method of claim 9, wherein the IC is one of an application-specific integrated circuit (ASIC), a structured ASIC, a field-programmable gate array (FPGA), a programmable logic device (PLD), a complex programmable logic device (CPLD), a system on chip (SOC), and a system-in-package (SIP).

17. The method of claim 9, wherein the IC includes at least one reconfigurable circuit that reconfigures during an operation of the IC.

18. The method of claim 17, wherein at least one reconfigurable circuit is for reconfiguring at a first clock rate that is faster than a second clock rate specified for a particular design of the IC.

19. The method of claim 18, wherein the second clock comprises a clock cycle comprising a plurality of sub-cycles, wherein placing the IC components comprises assigning each node in the second set of nodes to a particular sub-cycle of the second clock.

20. The method of claim 9, wherein optimizing the IC design comprises modifying the IC design to meet a timing requirement based on a relationship between the event times and the spatial distance for each edge.

21. A non-transitory computer readable medium storing a computer program for designing an integrated circuit (IC), the IC design expressed as a graph comprising a plurality of edges and a plurality of nodes representing a plurality of IC components, each edge connecting two nodes without encompassing a third node, the computer program for execution by at least one processor, the computer program comprising sets of instructions for:

defining a cost function that has a cost expression for each edge that is based on (i) a spatial relationship comprising a difference in horizontal and vertical coordinates of the two nodes of the edge and (ii) a temporal relationship comprising a difference between event times of the two nodes of the edge;

optimizing the IC design based by changing at least one of an event time and a coordinate of a node and modifying the IC design to satisfy a set of constraints on each component of the cost function such that, for each edge, a difference between the event times of the nodes connected by the edge is not less than a signal propagation delay caused by the spatial relationship between the two nodes connected by the edge; and placing the IC components based on the optimized IC design.

22. The non-transitory computer readable medium of claim 21, wherein the IC includes at least one reconfigurable circuit that reconfigures during an operation of the IC.

23. The non-transitory computer readable medium of claim 22, wherein at least one reconfigurable circuit is for reconfiguring at a first clock rate that is faster than a second clock rate specified for a particular design of the IC.

24. The non-transitory computer readable medium of claim 23, wherein the second clock comprises a clock cycle comprising a plurality of sub-cycles, wherein the set of instructions for placing the IC components comprises a set of instructions for assigning each node in the second set of nodes to a particular sub-cycle of the second clock.

25. A method of designing an integrated circuit ("IC"), wherein the IC design is expressed as a graph comprising a plurality of edges and a plurality of nodes representing a plurality of IC components, each edge connecting two nodes without encompassing a third node, the method comprising:

defining a cost function that has a component for each edge that is based on (i) signal temporal values for the two nodes of the edge, and (ii) a spatial relationship comprising a difference between coordinates of the two nodes of the edge;

by a computer, iteratively examining different placement solutions by changing at least one of a signal temporal value and a coordinate of a node and modifying the IC design to satisfy a set of constraints on each component of the cost function such that, for each edge, a difference between the temporal values of the nodes connected by the edge is not less than a signal propagation delay caused by the spatial relationship between the two nodes connected by the edge; and placing the IC components based on an optimal placement solution according to the cost function.

26. The method of claim 25, wherein the placing is performed only once after the examining of different placement solutions.

27. The method of claim 25, wherein the optimal placement solution is identified by satisfying a set of constraints on the component of the cost function for each edge.

28. The method of claim 27, wherein the set of constraints for an edge is satisfied when a difference between the signal temporal values of the nodes of the edge is not less than a signal propagation delay caused by a spatial distance between the two nodes of the edge.

* * * * *